(12) United States Patent
Kim et al.

(10) Patent No.: US 10,229,929 B2
(45) Date of Patent: Mar. 12, 2019

(54) SEMICONDUCTOR MEMORY DEVICES INCLUDING PROTRUSION PADS

(71) Applicant: Samsung Electronics Co., Ltd., Suwon-si, Gyeonggi-do (KR)

(72) Inventors: Kwang-Soo Kim, Hwaseong-si (KR); Se Mee Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/652,648

(22) Filed: Jul. 18, 2017

(65) Prior Publication Data
US 2018/0166462 A1    Jun. 14, 2018

(30) Foreign Application Priority Data
Dec. 9, 2016 (KR) .................. 10-2016-0167935

(51) Int. Cl.
```
H01L 27/11582    (2017.01)
H01L 27/11565    (2017.01)
H01L 27/11575    (2017.01)
H01L 27/1157     (2017.01)
H01L 23/535      (2006.01)
```

(52) U.S. Cl.
CPC ...... *H01L 27/11582* (2013.01); *H01L 23/535* (2013.01); *H01L 27/1157* (2013.01); *H01L 27/11565* (2013.01); *H01L 27/11575* (2013.01)

(58) Field of Classification Search
CPC ........... H01L 27/2481; H01L 27/11582; H01L 27/49503; H01L 23/535; H01L 2027/11866; H01L 29/792; H01L 29/41775; H01L 29/66696; H01L 29/66727; H01L 2924/1434
See application file for complete search history.

(56) References Cited

U.S. PATENT DOCUMENTS

| | | | |
|---|---|---|---|
| 2014/0217518 A1* | 8/2014 | Shih | H01L 27/11573 257/401 |
| 2016/0041783 A1 | 2/2016 | Choi et al. | |
| 2016/0343821 A1* | 11/2016 | Chiou | H01L 29/458 |
| 2017/0271256 A1* | 9/2017 | Inatsuka | H01L 23/528 |

FOREIGN PATENT DOCUMENTS

KR   1020150105567   9/2015

* cited by examiner

*Primary Examiner* — Cheung Lee
*Assistant Examiner* — Stephen C Smith
(74) *Attorney, Agent, or Firm* — Myers Bigel, P.A.

(57) ABSTRACT

Disclosed is a semiconductor memory device may include a substrate including a cell array region and a contact region and a stacking structure including a plurality of insulating layers and a plurality of gate electrodes alternately stacked on the substrate. The stacking structure may include a stepwise structure in the contact region. Ones of the plurality of gate electrodes may include a respective pad unit that comprises a step of the stepwise structure. At least one of the pad units may include a base pad and a protrusion pad on the base pad. The protrusion pad may be between and spaced apart from two edges of a surface of the base pad that are perpendicular to an extension direction of the respective gate electrode.

12 Claims, 21 Drawing Sheets

SEMICONDUCTOR MEMORY DEVICES INCLUDING PROTRUSION PADS

CROSS-REFERENCE TO RELATED APPLICATION

This application claims priority under 35 U.S.C. § 119 to Korean Patent Application No. 10-2016-0167935, filed in the Korean Intellectual Property Office on Dec. 9, 2016, the entire contents of which are hereby incorporated herein by reference.

BACKGROUND

Embodiments of the inventive concepts relate to semiconductor memory devices, and more particularly, to semiconductor memory devices including stepwise structures.

Integration of a semiconductor memory device may be increased to satisfy performance and price demands of consumers. In the case of 2D or planar semiconductor memory devices, since integration may be primarily determined by an area occupied by a unit memory cell, the integration may be largely influenced by a level of a minute pattern forming technology.

In order to achieve the minute pattern, high-priced equipment may be used, and, as a result, integration of the 2D semiconductor memory devices may be limited. In order to improve integration, 3D semiconductor memory devices may include memory cells which are arrayed in 3D.

The above information disclosed in this Background section is only for enhancement of understanding of the background of the invention and therefore it may contain information that does not form the prior art.

SUMMARY

Embodiments of the inventive concepts may provide semiconductor memory devices having enhanced reliability.

According to some embodiments of the inventive concepts, semiconductor memory devices are provided. A semiconductor memory device may include a substrate including a cell array region and a contact region and a stacking structure including a plurality of insulating layers and a plurality of gate electrodes alternately stacked on the substrate. The stacking structure may include a stepwise structure in the contact region. Ones of the plurality of gate electrodes, may include a respective pad unit that comprises a step of the stepwise structure. At least one of the pad units may include a base pad and a protrusion pad on the base pad. The protrusion pad may be between and spaced apart from two edges of a surface of the base pad that are perpendicular to an extension direction of the respective gate electrode.

According to some embodiments of the inventive concepts, semiconductor memory devices are provided. A semiconductor memory device may include a substrate including a cell array region and a contact region and a stacking structure including a plurality of insulating layers and a plurality of gate electrodes alternately stacked on the substrate. The stacking structure may include a stepwise structure in the contact region. Ones of the plurality of gate electrodes may include a respective pad unit that comprises a step of the stepwise structure. At least one of the pad units may include a base pad and a protrusion pad on the base pad. An uppermost surface of the base pad may include a first region that overlaps with the protrusion pad and a second region that, does not overlap with the protrusion pad. The first region and the second region may be arranged in, an extension direction of the gate electrode.

According to some embodiments of the inventive concepts, semiconductor memory devices are provided. A semiconductor memory device may include a substrate including a cell array region and a contact region in an upper surface of the substrate. The semiconductor memory device may include a plurality of gate electrodes stacked on the upper surface of the substrate in a vertical direction perpendicular to the upper surface of the substrate. The plurality of gate electrodes may extend from the cell array region to the contact region in an extension direction parallel to the upper surface of the substrate and may include respective base pad regions in the contact region that are exposed in a stepwise structure. The base pad regions may include respective upper surfaces that are coplanar with upper surfaces of the respective gate electrodes. The semiconductor memory device may include at least one protrusion pad extending, in the vertical direction from at least one respective base pad region. An edge of the at least one protrusion pad perpendicular to the extension direction may be offset from a respective edge of the at least one, respective base pad region in the extension direction to expose a portion of the at least one respective base pad region.

According to some embodiments, a semiconductor memory device can enhance reliability in a contact region.

DETAILED DESCRIPTION

Figure 1:
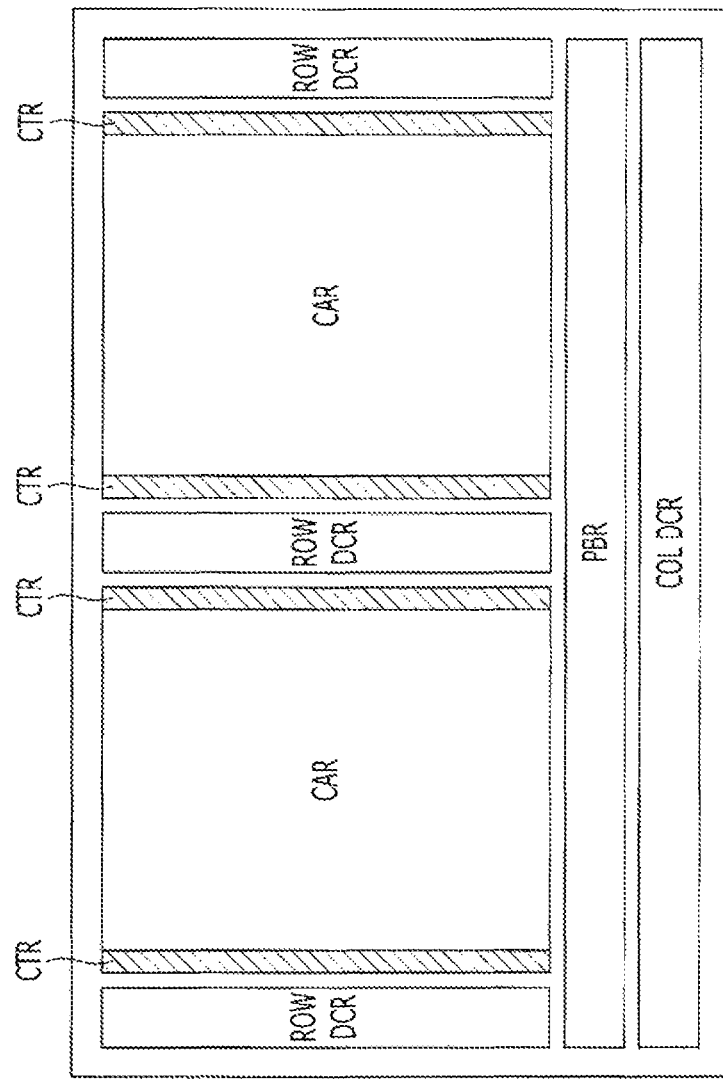
FIG. 1 is a block diagram illustrating a schematic configuration of a plan view of a semiconductor memory device according to some embodiments of the inventive concepts.

The inventive concepts will be described more fully hereinafter with reference to accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as, well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the terra "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

Figure 2:
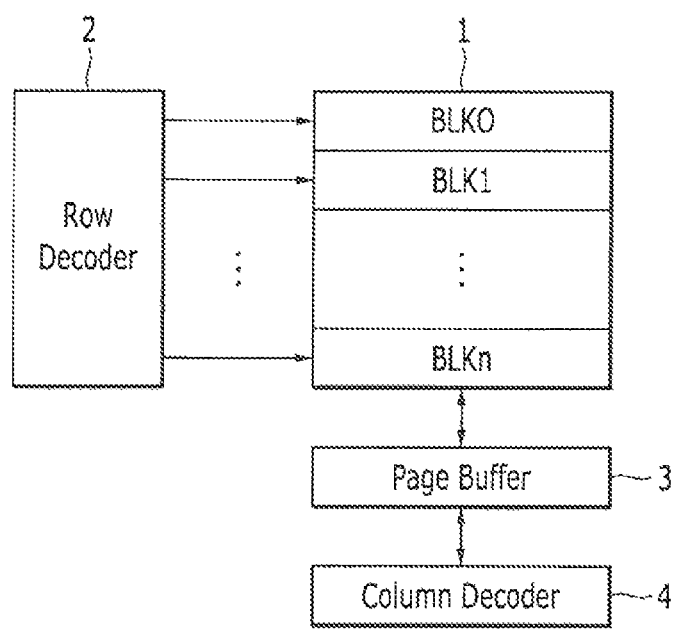
FIG. 2 is a block diagram of a semiconductor memory device according to some embodiments of the inventive concepts.

FIG. 1 is a block diagram illustrating a schematic configuration of a plan view or a semiconductor memory device according to some embodiments of the inventive concepts. FIG. 2 is a block diagram of a semiconductor memory device according to some embodiments of the inventive concepts. Hereinafter, a schematic configuration of a semiconductor memory device according to some embodiments of the inventive concepts will be described with reference to FIGS. 1 and 2.

Referring to FIG. 1, a semiconductor memory device according to some embodiments of the inventive concepts may include a cell array region (CAR) and a peripheral circuit region. The peripheral circuit region may include a row decoder region ROW DCR a page buffer region PBR, a column decoder region COL DCR, and a contact region CTR. The contact region CTR may be between the cell array region CAR and the row decoder region ROW DCR.

Referring to FIGS. 1 and 2, a memory cell array 1 including a plurality of memory cells may be in the cell array region CAR. The memory cell array 1 may further include a plurality of word lines and bit lines electrically connected with the plurality of memory cells. The memory cell array 1 may include a plurality of memory blocks BLK0 to BLKn as a data erase unit. The memory cell array 1 may be described later in more detail.

A row decoder 2 for selecting word lines of the memory cell array 1 may be in the row decoder region ROW DCR. A wire structure electrically connecting the memory cell array 1 and the row decoder 2 may be in the contact region CTR. The row decoder 2 may select one of the memory blocks BLK0 to BLKn of the memory cell array 1 and select one of the word lines of the selected memory block, according to address information.

A page buffer 3 for reading information stored in memory cells may be in the page buffer region PBR. The page buffer 3 may temporarily store data to be stored in the memory cells or sense the data stored in the memory cells, according to an operation mode. The page buffer 3 may operate as a write driver circuit in a program operation mode and a sense amplifier circuit in a read operation mode.

A column decoder 4 connected with bit lines of the memory cell array 1 may be in the column decoder region COL DCR. The column decoder 4 may provide a data transmission path between the page buffer 3 and an external device (for example, a memory controller).

Figure 3:
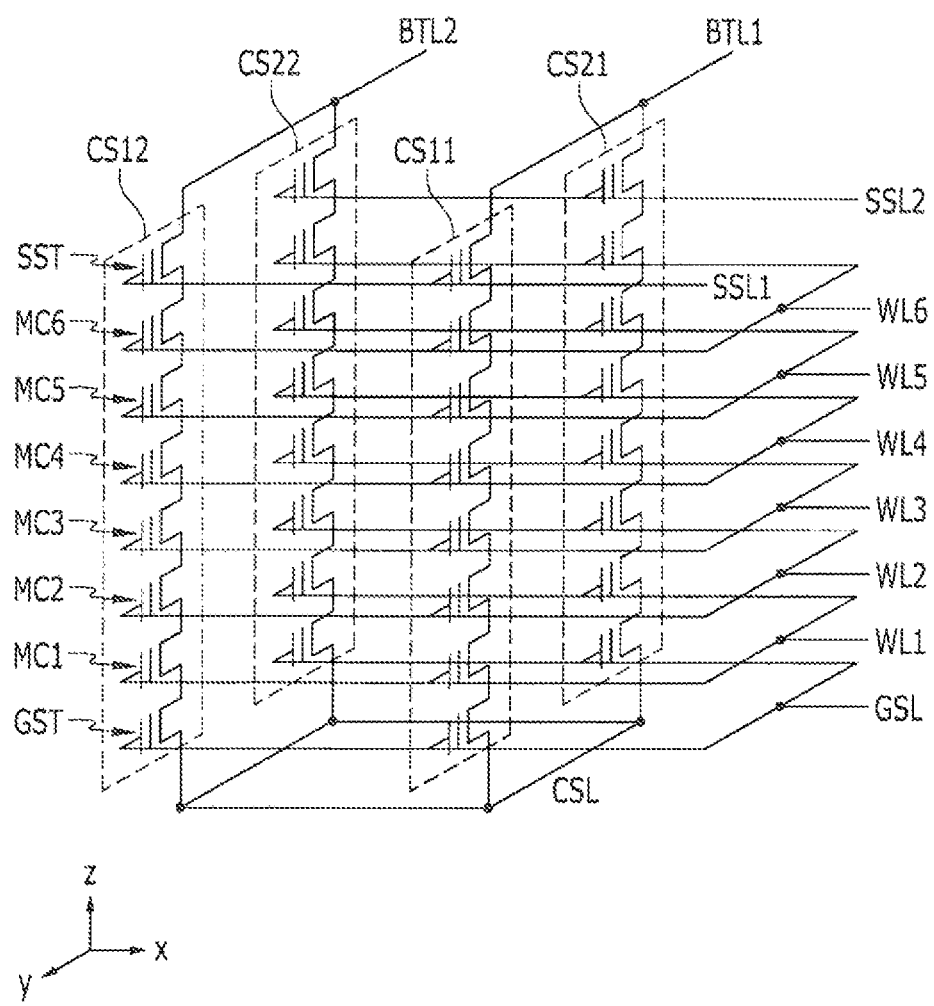
FIG. 3 is a circuit diagram illustrating a cell array of a semiconductor memory device according to some embodiments of the inventive concepts.

Hereinafter, a cell array region of the semiconductor memory device will be described with reference to FIG. 3. FIG. 3 is a circuit diagram illustrating a cell array of a semiconductor memory device according to some embodiments of the inventive concepts.

The memory cell array may include a plurality of cell strings CS11, CS12, CS21, and CS22 which may extend in a vertical direction. The plurality of cell strings may have a vertical structure in which the plurality of cell strings extends in a vertical direction (z direction) to a plane of a substrate.

Ones of the plurality of cell strings CS11, CS12, CS21, and CS22 may include a ground selection transistor GST, a plurality of memory cell transistors MC1, MC2, . . . , MC6, and a string selection transistor SST connected in series. In FIG. 3, each of the cell strings CS11, CS12, CS21, and CS22 has one string selection transistor SST and one ground selection transistor GST, but in some embodiments ones of the cell strings CS11, CS12, CS21, and CS22 may not be limited thereto and may include, for example, two or more string selection transistors and/or two or more ground selection transistors. Further, in FIG. 3, each of the cell strings CS11, CS12, CS21, and CS22 includes 6 memory cell transistors MC1, MC2, . . . , MC6, but in some embodiments ones of the cell strings CS11, CS12, CS21, and CS22 may not be limited thereto and may include, for example, at least 8 memory cell transistors MCx.

The plurality of cell strings CS11, CS12, CS21, and CS22 may be arrayed and connected in a matrix direction. The string selection transistors SST of the cell strings CS11, CS12, CS21, and CS22 may be connected with corresponding bit lines BTL1 and BTL2. For example, the cell strings CS11 and CS21 may be commonly connected to a first bit line BTL1 and may be arrayed along a first column and the cell strings CS12 and CS22 may be commonly connected to the second bit line BTL2 and may be arrayed along a second column. The string selection transistors SST of the cell strings CS11, CS12, CS21, and CS22 may be connected with string selection lines SSL1 and SSL2. For example, the cell strings CS11 and CS12 commonly connected to a first string selection line SSL1 may be arrayed along a first row and the cell strings CS21 and CS22 commonly connected to the second string selection line SSL2 may be arrayed along a second row.

The ground selection transistors GST of the cell strings CS11, CS12, CS21, and CS22 may be connected with the ground selection line GSL. A common source line CSL, may be connected with the ground selection transistors GST of the cell strings CS11, CS12, CS21, and CS22.

The memory cell transistors MC1, MC2, ..., MC6 that are positioned at the same height may be connected to a respective one of the word lines WL1, WL2, ..., WL6 that is positioned at the same height. For example, a first memory cell transistor MC1 connected with the ground selection transistor GST may be connected with a first memory cell transistor MC1 of an adjacent column through a first word line WL1.

The common source line CSL may be commonly connected to a source of the ground selection transistor GST. In addition, the ground selection line GSL, the plurality of word lines WL1, WL2, ..., WL6, and the string selection line SSL between the common source line CSL and the bit lines BTL1 and BTL2 may be used as gate electrodes of the ground selection transistor GST, the memory cell transistors MC1, MC2, ..., MC6, and the string selection transistor SST, respectively. Further, the memory cell transistors MC1, MC2, ..., MC6 may include respective data storage elements.

Figure 4A:
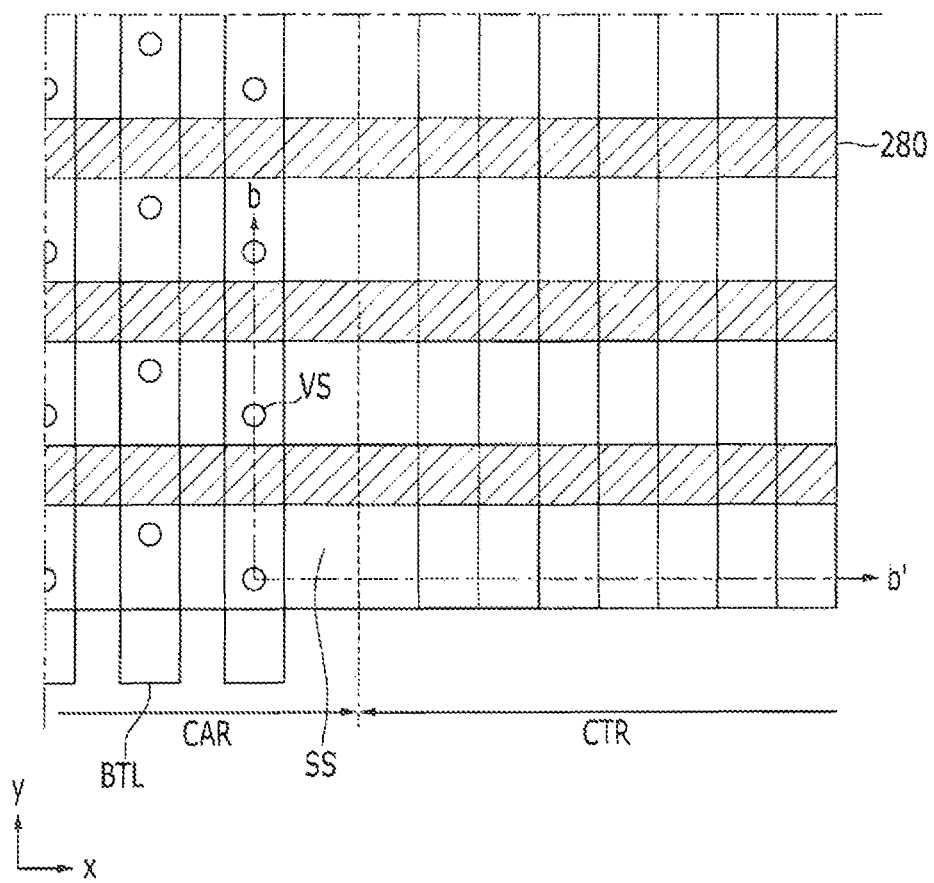
FIG. 4A is a plan view of a partial region of a semiconductor memory device according to some embodiments of the inventive concepts.

Hereinafter, the semiconductor memory device according to some embodiments of the inventive concepts will be described with reference to FIGS. 4A, 4B, 4C, and 5. FIG. 4A is a plan view of a partial area of a semiconductor memory device according to some embodiments of the inventive concepts, FIG. 4B is a cross-sectional view taken along line b-b' of FIG. 4A, FIG. 4C is an enlarged view illustrating part C of FIG. 4B, and FIG. 5 is a perspective view illustrating a partial component of a contact region of a semiconductor memory device according to some embodiments of the inventive concepts.

Figure 4B:
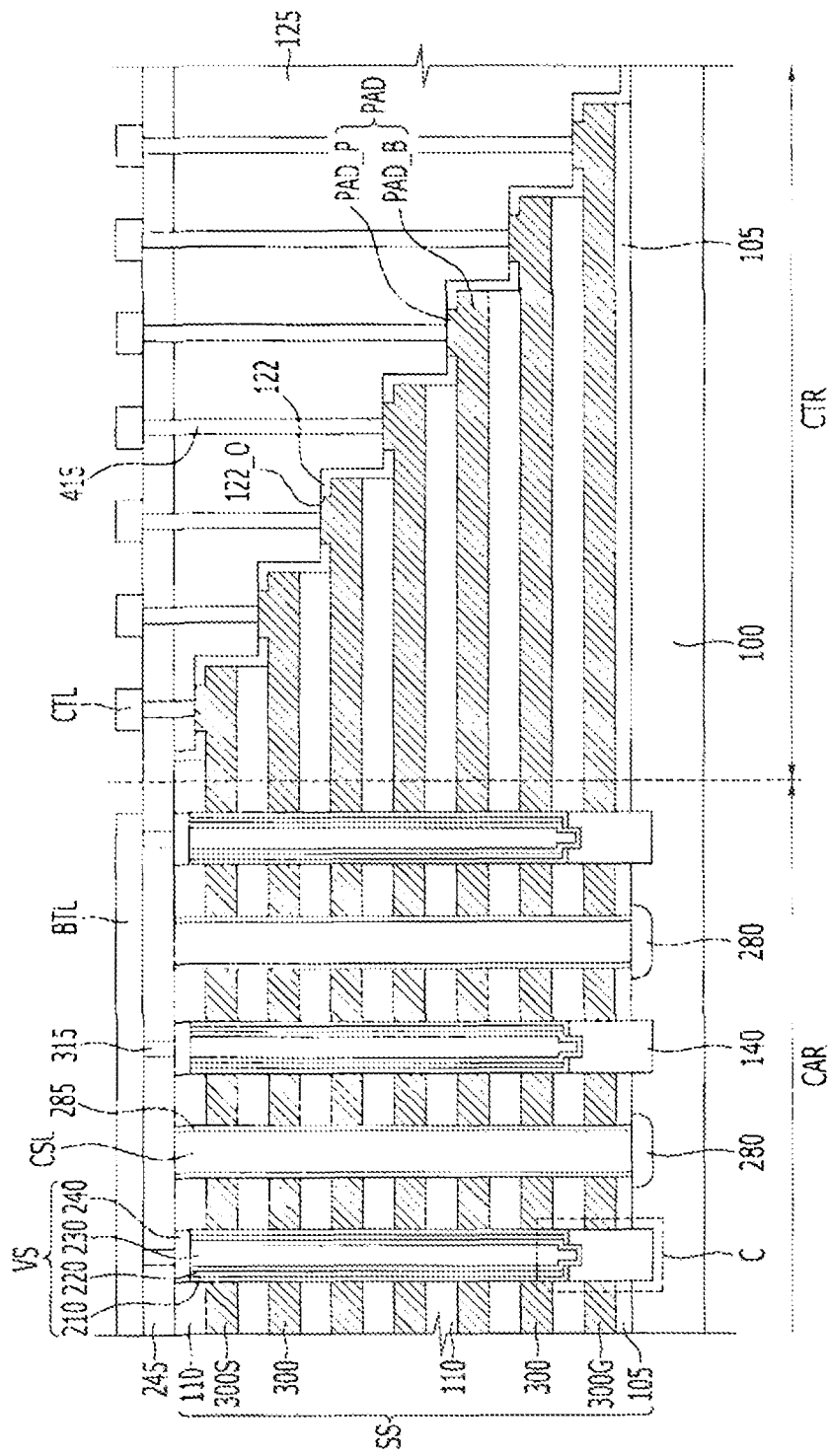
FIG. 4B is a cross-sectional view taken along line b-b' of FIG. 4A.
Figure 4C:
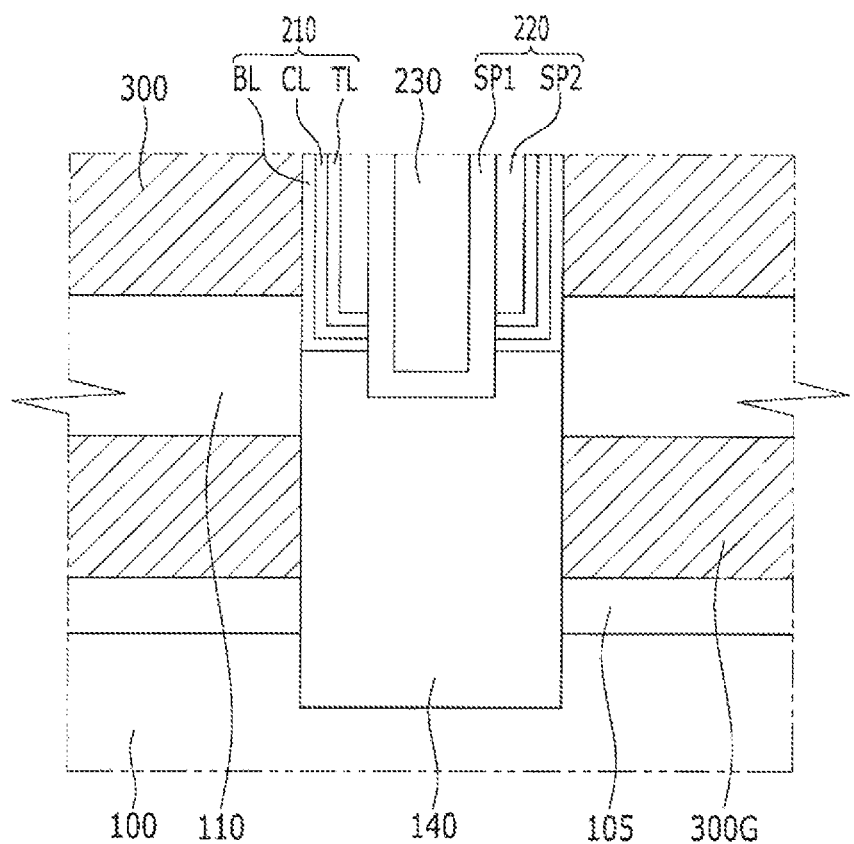
FIG. 4C is an enlarged view illustrating part C of FIG. 4B.
Figure 5:
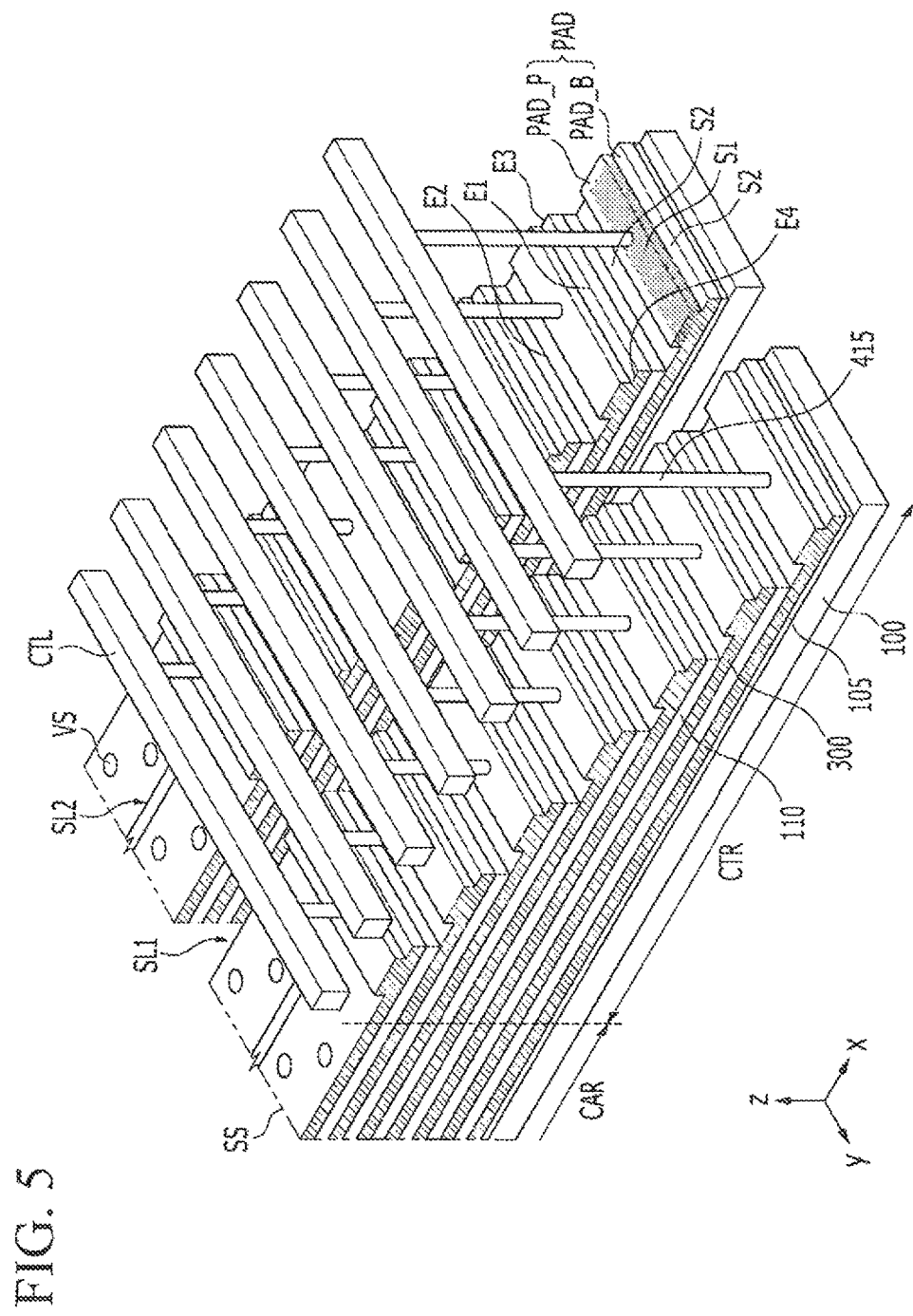
FIGS. 5, 6, and 7 are perspective views illustrating a partial component of a contact region of a semiconductor memory device according to some embodiments of the inventive concepts.

Referring to FIGS. 4A and 4B, a substrate 100 of the semiconductor memory device according to some embodiments of the inventive concepts may include the cell array region CAR and the contact region CTR positioned on the periphery of the cell array region CAR. A vertical pattern structure VS, a stacking structure SS, and a bit line BTL may be on the substrate 100.

The substrate 100 may include a semiconductor material and may be, for example, a silicon substrate, a germanium substrate, a silicon-germanium substrate, or a silicon-on-insulator (SOI) substrate. In some embodiments, the substrate 100 may include a p-type impurity.

The substrate 100 may include a plurality of common source regions 280 doped with impurities. Ones of the common source regions 280 may have a line form which extends in an x direction parallel to an uppermost surface of the substrate 100. The plurality of common source regions 280 may be arrayed in line in a y direction, in some embodiments, the common source regions 280 may include an n-type impurity injected in the substrate 100.

The stacking structure SS on the substrate 100 may include a plurality of insulating layers 110 and a plurality of gate electrodes 300 which are alternately stacked. A plurality of stacking structures SS may be provided and hereinafter, one stacking structure SS will be primarily described.

The stacking structure SS may have a line form which extends in the x direction and the common source regions 280 may be positioned at both sides of the stacking structure SS. The stacking structures SS and the common source regions 280 may be alternately positioned in the y direction.

The common source line CSL may be between adjacent stacking structures SS and may penetrate a plurality of gate electrodes 300 and, a plurality of insulating layers 110 in a vertical direction (z direction) that is perpendicular to the uppermost surface of the substrate 100.

The common, source line CSL may contact the substrate 100. In particular, the common source line CSL may contact the common source region 280. A trench spacer 285 between the common source line CSL and the gate electrode 300 may electrically insulate the common source line CSL and the gate electrode 300 adjacent in the y direction.

The stacking structure SS may further include a lower insulating layer 105 between a gate electrode 300G at a lowermost end and the substrate 100. In some embodiments, the lower insulating layer 105 may include a high dielectric layer such as a silicon nitride layer, an aluminum oxide layer, or a hafnium oxide layer. The lower insulating layer 105 may have a smaller thickness than another insulating layer 110.

The plurality of gate electrodes 300 may be stacked in the z direction that is perpendicular to the uppermost surface of the substrate 100. The plurality of gate electrodes 300 may be spaced in the z direction by the insulating layers 110 therebetween.

The gate electrode 300G at the lowermost end among the plurality of gate electrodes 300 may be the ground selection line of the ground selection transistor GST described with reference to FIG. 3. A gate electrode 300S at an uppermost end among the plurality of gate electrodes 300 may be the string selection line of the string selection transistor SST described with reference to FIG. 3. The plurality of gate electrodes 300 between the gate electrode 300G at the lowermost end and the gate electrode 300S at the uppermost end may be the word lines of the memory cell transistors MCx described with reference to FIG. 3.

The plurality of gate electrodes 300 may include doped silicon, metal (for example, tungsten, copper, and aluminum), metal nitride (for example, nitride titanium, nitride tantalum, and the like), metal silicide, or a combination thereof. The plurality of insulating layers 110 may be, for example, silicon oxide layers.

The lower semiconductor pattern 140 may protrude from the uppermost surface of the substrate 100. The lower semiconductor pattern 140 may be a semiconductor having a conductivity type (for example, a p type) the same as the substrate 100 or may be an intrinsic semi conductor.

A plurality of vertical pattern structures VS may be on and connected to the lower semiconductor patterns 140 by penetrating the stacking structure SS. The vertical pattern structures VS may be surrounded by the stacking structure SS on an xy-direction plane.

Ones of the vertical pattern structures VS may include a vertical channel pattern 220 connected with the lower semiconductor pattern 140, a vertical insulating pattern 210 positioned between the vertical channel pattern 220 and the stacking structure SS, a filling insulating pattern 230 filling an inner surface of the vertical channel pattern 220, and a conductive pad 240.

A bit line contact plug 315 may connect the conductive pad 240 and the bit line BTL with each other by penetrating a capping layer 245. The bit line contact plug 315 may be a connection line contact plug. The bit line BTL may extend in the y direction crossing over the stacking structure SS.

Referring to FIG. 4C, the vertical pattern structure VS will be described in detail.

The vertical insulating pattern 210 may include a blocking insulating layer BL, a charge storing layer CL, and a tunnel insulating layer TL sequentially stacked on the inner surface of the stacking structure S.

The charge storing layer CL may include a silicon nitride layer, a silicon oxynitride layer, a silicon (Si)-rich nitride layer, nanocrystalline silicon (Si), and/or a laminated trap player. The tunnel insulating layer TL may contain a material having a larger band gap than the charge storing layer CL. For example, the tunnel insulating layer TL may be a silicon oxide layer. The blocking insulating layer BL may contain a material having a larger energy band gap than the charge storing layer CL. For example, the blocking insulating layer BL may include a silicon oxide layer, a silicon oxynitride layer, an aluminum oxide layer, and/or a hafnium oxide layer.

The vertical channel pattern 220 may include a first semiconductor pattern SP1 connected to the lower semiconductor pattern 140 and a second semiconductor pattern SP2 between the first semiconductor pattern SP1 and the vertical insulating pattern 210.

The first semiconductor pattern SP1 may have a pipe shape in which one end is closed, a hollow cylindrical shape in which one end is closed, or, in other words, a cup shape. The second semiconductor pattern SP2 may have an open hollow cylindrical shape or, in other words, a macaroni shape.

The vertical channel pattern 220 may include single crystal silicon, polycrystalline silicon, or amorphous silicon. The vertical channel pattern 220 may be in an undoped state or may be doped with impurities having the same conductivity type as the substrate 100.

The filling insulating pattern 230 may fill an inside of the vertical channel pattern 220. The filling insulating pattern 230 may include silicon oxide, silicon oxynitride, and/or silicon nitride.

Referring to FIGS. 4B and 5, the contact region CTR of the semiconductor memory device will be described in detail. FIG. 5 is a perspective view in which some components are omitted for description.

Referring to FIG. 5, adjacent stacking structures SS among the plurality of stacking structures SS may be spaced apart from each other by a first slit SL1. Ones of the plurality of stacking structures SS may include a second slit SL2 in the cell array region CAR. The first slit SL1 and the second slit SL2 may overlap with the common source region 280 and may be changed according to some embodiments of the inventive concepts. The first slit SL1 and the second slit SL2 may be filled with insulating materials.

As illustrated in FIGS. 4B and 5, the stacking structure SS positioned in the cell array region CAR may extend up to the contact region CTR for electrical connection with a peripheral circuit. The plurality of gate electrodes 300 and the plurality of insulating layers 110 may extend from the cell array region CAR into the contact region CTR.

The plurality of gate electrodes 300 and the plurality of insulating layers 110 in the contact region CTR may have a stepwise structure. The stepwise structure may be a form in which the plurality of gate electrodes 300 and insulating layers 110 elongate to the contact region CTR toward the substrate 100. In the contact region CTR, a vertical thickness of the stacking structure SS may increase stepwise as the stacking structure approaches the cell array region CAR.

An end of the gate electrode 300 exposed through the stepwise structure may be a pad unit PAD. One or more of the plurality of pad units PAD may include a base pad PAD_B and a protrusion pad PAD_P contacting a surface of the base pad PAD_B.

The base pad PAD_B may be a part of the gate electrode 300 in the contact region CTR. The base pad PAD_B may be exposed by an adjacent pad unit PAD that is stacked on the pad unit PAD. The pad unit PAD and the adjacent pad unit PAD may not overlap with each other.

The base pad PAD_B may have the same thickness as the gate electrode 300 positioned in the cell array region CAR.

The protrusion pad PAD_P may contact the surface of the base pad PAD_B, for example, an uppermost surface of the base pad PAD_B. The surface of the base pad PAD_B positioned at an n-th row based on the substrate 100 may be exposed by the base pad PAD_B positioned at an n+1-th row. That is, the protrusion pad PAD_P may contact the uppermost surface of a base pad PAD_B that is exposed by the adjacent base pad PAD_B.

The surface of the base pad PAD_B may include a first region S1 which overlaps with the protrusion pad PAD_P and second regions S2 other than the first region S1. The surface of the base pad PAD_B may include a second region S2, the first region S1, and another second region S2 disposed in an extension direction (x direction) of the gate electrode 300. The end of the surface of the base pad PAD_B may include a region which does not overlap with the protrusion pad PAD_P. Therefore, an area in which the protrusion pad PAD_P contacts the base pad PAD_B may be smaller than an entire area of the surface of the base pad PAD_B.

The protrusion pad PD_P may extend from the one surface of the base pad PAD_B. The protrusion pad PAD_P may have an island shape with respect to the one surface of the base pad PAD_B. The protrusion pad PAD_P may include a step with respect to the surface of the base pad PAD_B.

Embodiments of the inventive concepts in which the protrusion pad PAD_P has a rectangular parallele shape is illustrated, but the protrusion pad PAD_P is not limited thereto and, in some embodiments, may have a shape including a curved surface based on a virtual rectangular parallele shape, a cylindrical shape, or any shape.

Referring to FIG. 5, the surface of the base pad PAD_B may include four edges E1, E2, E3, and E4. Two edges E1 and E2 among four edges E1, E2, E3, and E4 may be edges which are perpendicular to the extension direction (x direction) of the gate electrode 300 and two residual edges E3 and E4 may be edges parallel to the extension direction of the gate electrode 300. The edges E1 and E2 may be perpendicular to the extension direction and opposite from each other. The edges E3 and E4 may be parallel to the extension direction and opposite from each other. In other words, the edges E1 and E2 may be parallel to a width direction (y direction) of the gate electrode 300.

The protrusion pad PAD_P may be inside from the edges E1 and E2 perpendicular to the extension direction of the gate electrode 300. In other words, the protrusion pad PAD_P may be not aligned or overlap with the edges E1 and E2 perpendicular to the x direction. The protrusion pad PAD_P may have a shape in which the protrusion pad PAD_P is inside and spaced apart from the edges E1 and E2. In other words, the protrusion pad PAD_P may include two edges perpendicular to the extension direction and opposite from each other that are each offset from respective edges E1 and E2 of the respective base pad PAD_B in the extension direction to expose portions S2 of the respective base pad PAD_B.

Further, the protrusion pad PAD_P may include sides which are coplanar with the edges E3 and E4 parallel to the extension, direction (x direction) of the gate electrode 300. In other words, as illustrated in FIG. 5, xz-direction sides of the protrusion pad PAD_P may be aligned with the edges E3 and E4.

Meanwhile, a minimum distance in the z-direction between two adjacent pad units PAD among the plurality of pad units PAD may be smaller than a z-direction thickness of the insulating layer 110 positioned between two adjacent pad units PAD. The minimum distance in the z-direction between two adjacent pad units PAD among the plurality of pad units PAD may be a distance between the protrusion pad PAD_P positioned at the n-th row and the base pad PAD_B positioned at the n+1-th row based on the substrate 100. A z-direction thickness of the insulating layer 110 may be larger than the minimum distance in the z-direction between two adjacent pad units PAD to effectively prevent a short-circuit between the two adjacent pad units PAD.

Referring to FIGS. 4B and 5, an auxiliary insulating layer 122 may contact the uppermost surfaces and side surfaces of the base pads PAD_B in the contact region CTR. The auxiliary insulating layer 122 may contact the side surfaces of the base pads PAD_B and side surfaces of the insulating layers 110.

The auxiliary insulating layer 122 may have the stepwise structure along the plurality of gate electrodes 300 and insulating layers 110.

The auxiliary insulating layer 122 may have an opening 122_O and the protrusion pad PAD_P may be inside the opening 122_O. An uppermost surface of the auxiliary insulating layer 122 may be substantially coplanar with an uppermost surface of the protrusion pad PAD_P or the uppermost surface of the protrusion pad PAD_P may be positioned at a lower level than the uppermost surface of the auxiliary insulating layer 122.

The auxiliary insulating layer 122 may include the same or similar material as the insulating layer 110 and may be, for example, an oxide layer. In other words, the a auxiliary insulating layer 122 and the insulating layer 110 may include a common insulating material. When the auxiliary insulating layer 122 includes the same material as the insulating layer 110, a boundary between the auxiliary insulating layer 122 and the insulating layer 110 may not be distinguished and the auxiliary insulating layer 122 and the insulating layer 110 may form one structure.

The semiconductor memory device according to some embodiments of the inventive concepts may include the protrusion pad PAD_P to prevent etching of the base pad PAD_B, which may occur in a manufacturing process. The pad unit PAD having a predetermined thickness may be provided to stably contact the connection line CTL and the pad unit PAD.

Further, the semiconductor memory device may include the protrusion pad PAD_P inside from the edge of a surface of the base pad PAD_B to prevent the short-circuit between the pad units PAD positioned at different rows.

Further, the short-circuit between the pad units PAD may be effectively prevented through the auxiliary insulating layer 122 positioned between the adjacent protrusion pads PAD_P positioned at different rows. The semiconductor memory device according to same embodiments of the inventive concepts may have enhanced reliability.

A buried insulating layer 125 and the capping layer 245 may be on the auxiliary insulating layer 122. The buried insulating layer 125 may be on the contact region CTR covering the uppermost surface of the protrusion pad PAD_P and covering the auxiliary insulating layer 122. The capping layer 245 may be on the buried insulating layer 125. The capping layer 245 and the buried insulating layer 125 may each include a nitride layer and/or an oxide layer.

A word line contact plug 415 may electrically and physically connect the pad unit PAD of the gate electrode 300 to the connection line CTL by penetrating the capping layer 245 and the buried insulating layer 125. The word line contact plug 415 may be a connection line contact plug. A vertical length of the word line contact plug 415 may decrease as the word line contact plug 415 approaches the cell array region CAR.

Figure 6:
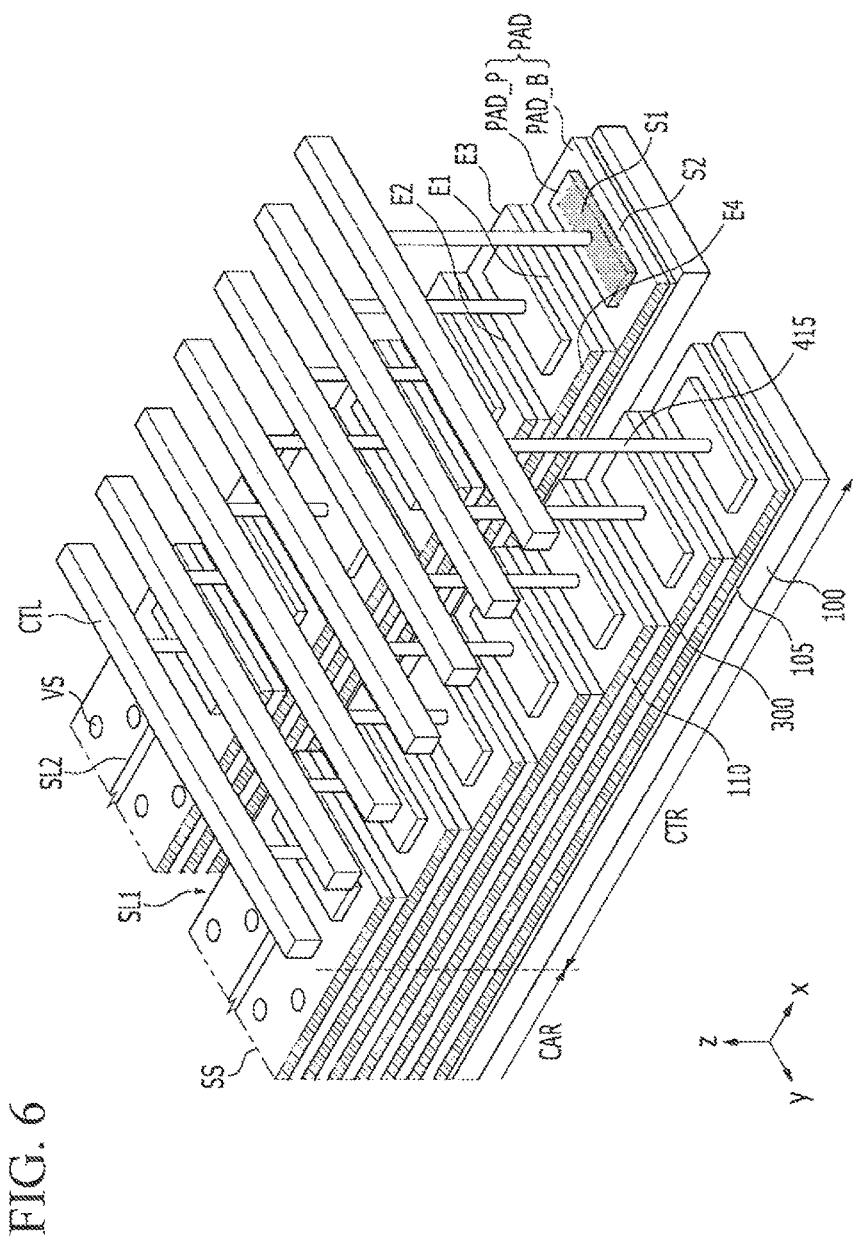
Figure 7:
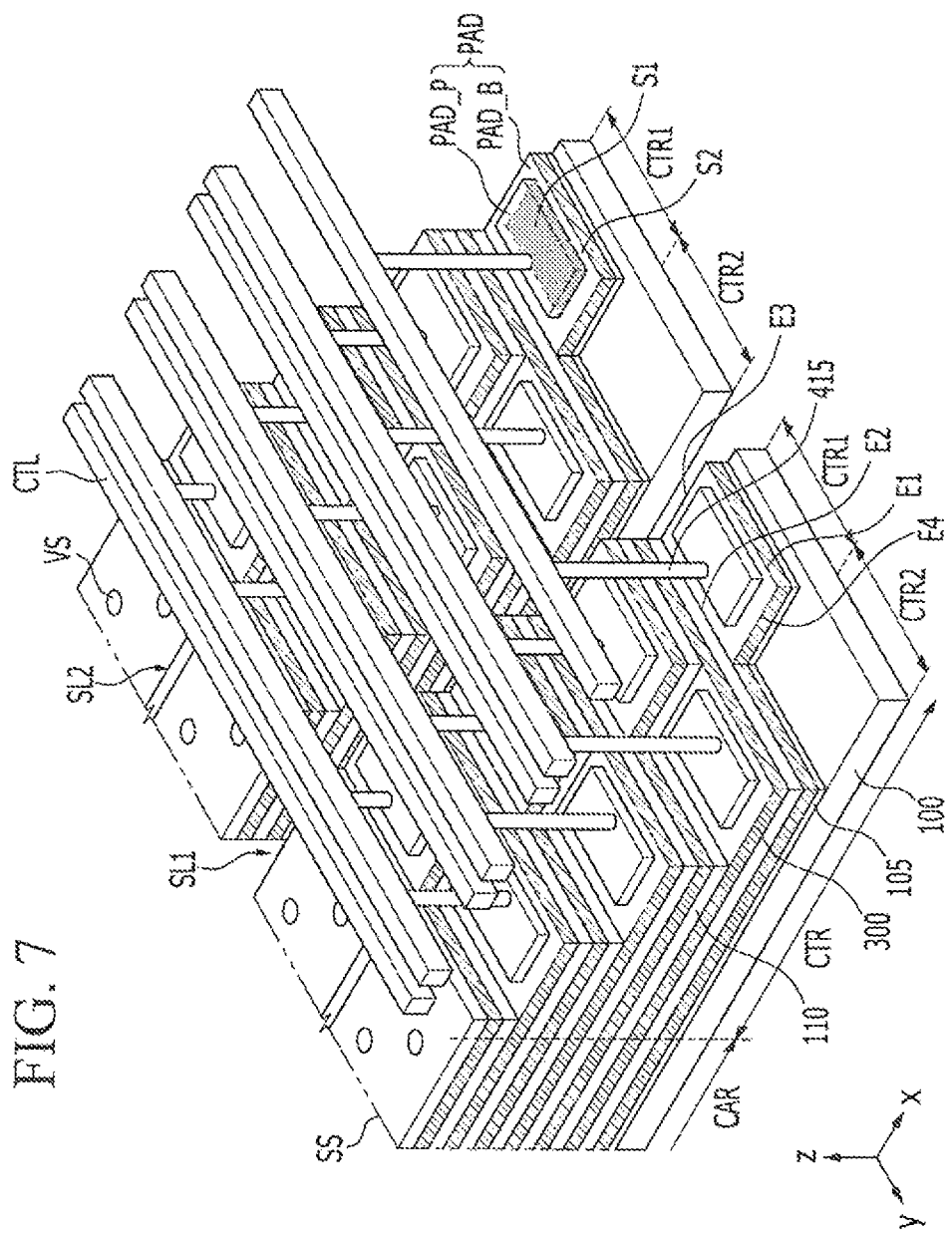
Figure 8:
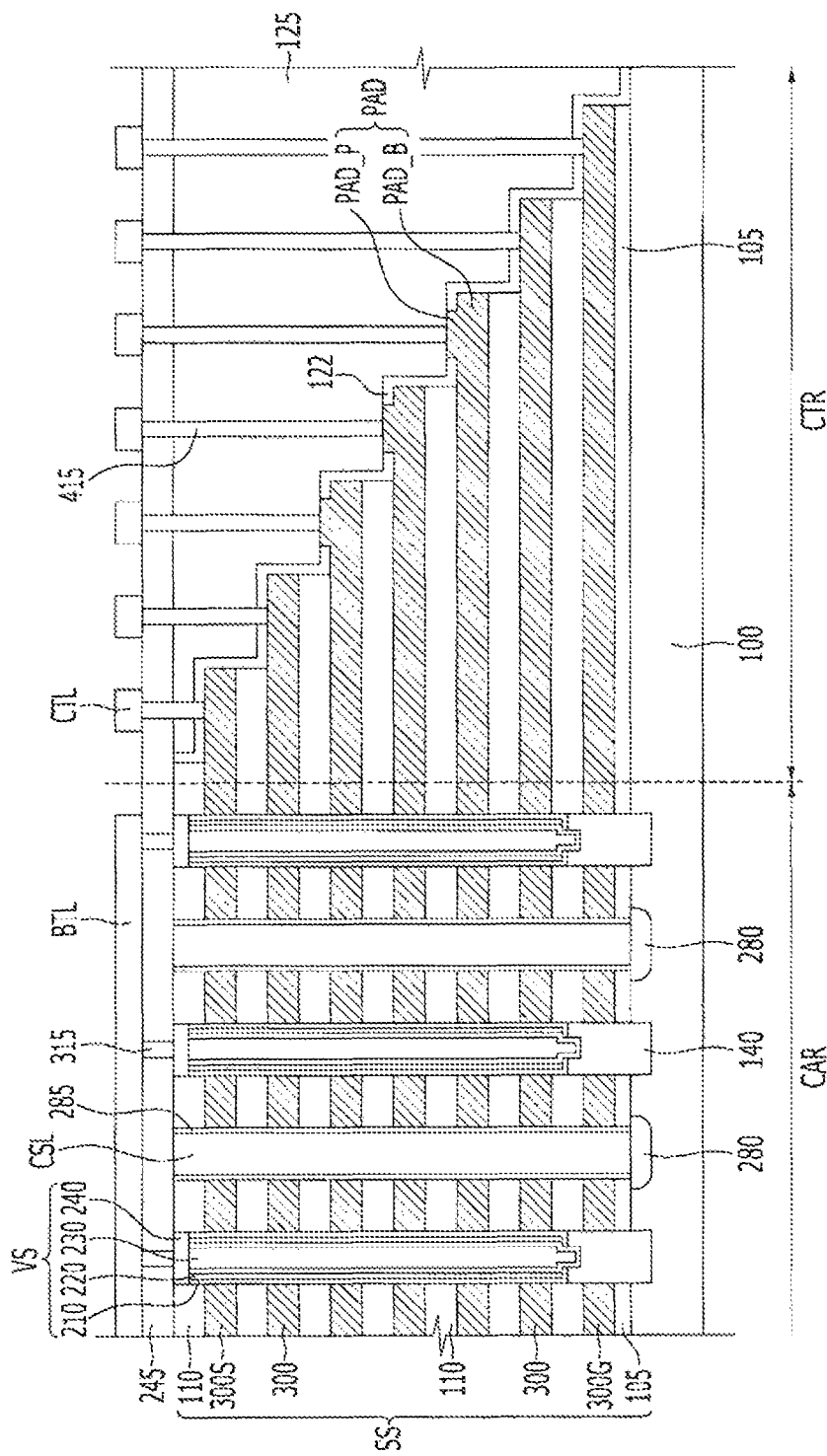
FIGS. 8 and 9 are cross-sectional-views illustrating a semiconductor memory device according to some embodiments of the inventive concepts.
Figure 9:
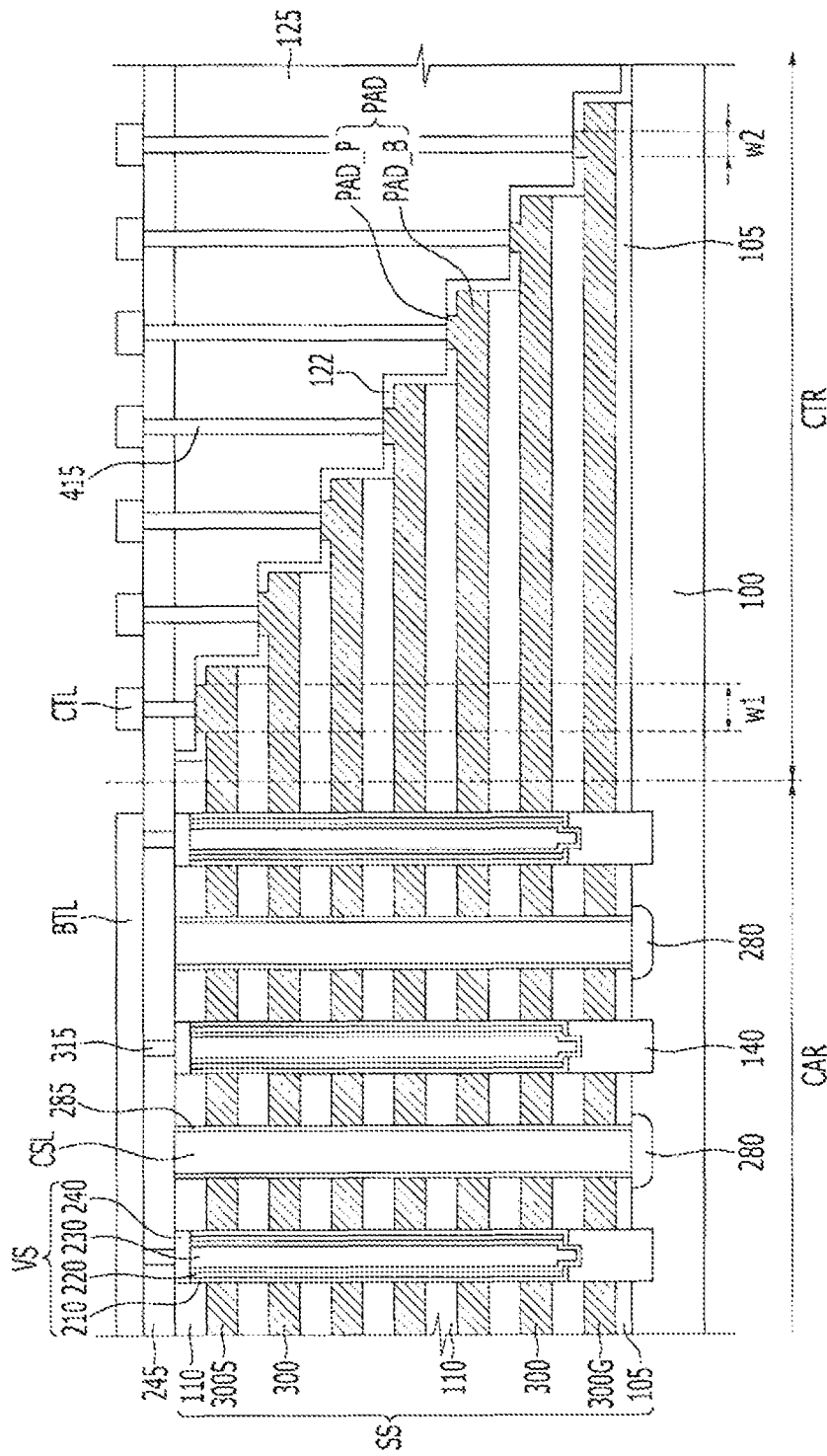

Hereinafter, a semiconductor memory device according to another some embodiment will be described with reference to FIGS. 6 to 9. FIGS. 6 and 7 are perspective views illustrating partial components of contact regions of semiconductor memory devices according to some embodiments of the inventive concepts and FIGS. 8 and 9 are cross-sectional views illustrating semiconductor memory devices according to some embodiments of the inventive concepts. Some elements of the semiconductor memory devices according to the embodiments illustrated in FIGS. 6 to 9 may be the same as or similar to corresponding elements described above with respect to FIGS. 1 to 5. Accordingly, some elements illustrated in FIGS. 6 to 9 may be briefly described or description thereof may be omitted.

Referring to FIG. 6, the protrusion pad PAD_P according to some embodiments of the inventive concepts may be positioned inside from four edges E1, E2, E3, and E4 of the surface of the base pad PAD_B.

In detail, the surface of the base pad PAD_B contacting the protrusion pad PAD_P may include four edges E1, E2, E3, and E4. The protrusion pad PAD_P may be positioned on the surface of the base pad PAD_B while being not overlapped or aligned with the four edges E1, E2, E3, and E4. The protrusion pad PAD_P may be inside and spaced apart from from the four edges E1, E2, E3, and E4.

The surface of the base pad PAD_B may include the first region S1 contacting the protrusion pad PAD_P and the second region S2 other than the first region S1. The surface of the base pad PAD_B according to some embodiments of the inventive concepts may include the second region S2, the first region S1, and again the second region S2 disposed in the extension direction (x direction) of the gate electrode 300 and similarly thereto, the surface of the base pad PAD_B may include the second region S2, the first region S1, and again the second region S2 disposed in the extension direction (x direction) of the gate electrode 300. The surface of the base pad PAD_B may have a shape in which the first, region S1 is at a center of the surface with the second region S2 surrounding the first region S1. In other words, the protrusion pad PAD_P may include two edges parallel to the extension direction and opposite from each other that are each offset from respective edges E3 and E4 of the respective base pad PAD_B in the extension direction to expose portions S2 of the respective base pad PAD_B.

The auxiliary insulating layer 122 may contact the second region S2 of the surface of the base pad PAD_B and the side of the base pad PAD_B in the contact region CTR.

Referring to FIG. 7, the contact region CTR according to some embodiments of the inventive concepts may include a first contact sub region CTR1 and a second contact sub region CTR2 which are repeatedly disposed. The first contact sub region CTR1 and the second contact sub region CTR2 may be connected to each other.

Each of the first contact sub region CTR1 and the second contact sub region CTR2 may have the stepwise structure in which each of the first contact sub region CTR1 and the second contact sub region CTR2 is inclined in the x direction. Further, each of the adjacent first contact sub region CTR1 and the second contact sub region CTR2 may include a stepwise structure in which each of the adjacent first contact sub region CTR1 and the second contact sub region CTR2 is inclined in the y direction. The stacking structure SS positioned in the contact region CTR may include the stepwise structure in which the stacking structure SS is inclined in the x direction and the y direction. When the stacking structure SS has the stepwise structure in which the stacking structure SS is inclined in the x direction and the y direction, an area of the contact region CTR in which the plurality of pad units PAD is positioned may be reduced. In other words, the stepwise structure SS may include two parallel rows of pad regions PAD.

Embodiments of the inventive concepts in which the contact region CTR includes the first contact sub region CTR1 and the second contact sub region CTR2 are illustrated, but the contact region CTR is not limited thereto and some embodiments may include two or more contact sub regions. That is, the contact region may be divided into n contact sub regions $CTR_n$.

At least one of the plurality of pad units PAD may include the base pad PAD_B and the protrusion pad PAD_P. The shape of the protrusion pad PAD_P may be the same as or similar to that of the embodiments of the inventive concepts described above, for example with reference to FIG. 6, and, therefore, the description thereof may be omitted.

According to some embodiments of the inventive concepts, the pad unit PAD including the protrusion pad PAD_P may be prevented from contacting another pad unit PAD adjacent in the x direction and prevented from contacting even another pad unit PAD adjacent in the y direction. Therefore, the semiconductor memory device may prevent the short-circuit between the gate electrodes 300 and may have the enhanced reliability.

Referring to FIG. 8, some of the plurality of pad units PAD according to some embodiments of the inventive concepts may include only the base pad PAD_B. For example, some of the plurality of pad units PAD may include the protrusion pad PAD_P and the residual pad units PAD may not include the protrusion pad PAD_P.

For example, the pad unit PAD positioned to be relatively adjacent to the substrate 100 and the pad unit PAD positioned to be adjacent to the capping layer 245 among the plurality of pad units PAD may not include the protrusion pad PAD_P and may include only the base pad PAD_B. Further, at least one of the plurality of pad units PAD positioned between the pad units PAD may include the base pad PAD_B and the protrusion pad PAD_P. The protrusion pad PAD_P may have the shapes described above, for example as illustrated in FIGS. 5 to 6, and therefore the description of the protrusion pad PAD_P may be hereinafter omitted.

The protrusion pad PAD_P may prevent the base pad PAD_B from being etched in a process of manufacturing a contact hole for forming the word line contact plug 415. A damage by the etching primarily occurs in the pad unit PAD positioned at au intermediate level. Therefore, in some embodiments of the inventive concepts, not all of the plurality of pad units PAD but only some pad units PAD in the corresponding, region may include the protrusion pad PAD_P.

Referring to FIG. 9, the sizes of the plurality of protrusion pads PAD_P according to some embodiments of the inventive concepts may be different from each other. For example, a width W1 of the protrusion pad PAD_P positioned at the uppermost end among the plurality of protrusion pads PAD_P may be larger than the width W2 of the protrusion pad PAD_P positioned at the lowermost end. The width of a protrusion pad may be the length of an edge parallel to the direction (x direction) in which the gate electrode 300 and the insulating layer 110 extend in the plurality of protrusion pads PAD_P. In other words, a first pad unit that that includes a protrusion pad may be closest to the uppermost insulating layer and a second pad unit that comprises a protrusion pad may be closest to the substrate and a width of the protrusion pad of the first pad unit that is closest to the uppermost insulating layer may be larger than a width of the protrusion pad of the second pad unit that is closest to the substrate.

For example, the width of the protrusion pads PAD_P may increase as the protrusion pads PAD_P become more remote from the substrate 100. A change in width may be gradual, stepwise, or irregular.

Hereinafter, manufacturing methods according to some embodiments of the inventive concepts will be described with reference to FIGS. 10 to 18. FIGS. 10, 11, 12, 13, 14, 15, 16, 17, and 18 are cross-sectional views illustrating intermediate operations of methods of manufacturing semiconductor memory devices according to some embodiments of the inventive concepts.

Figure 10:
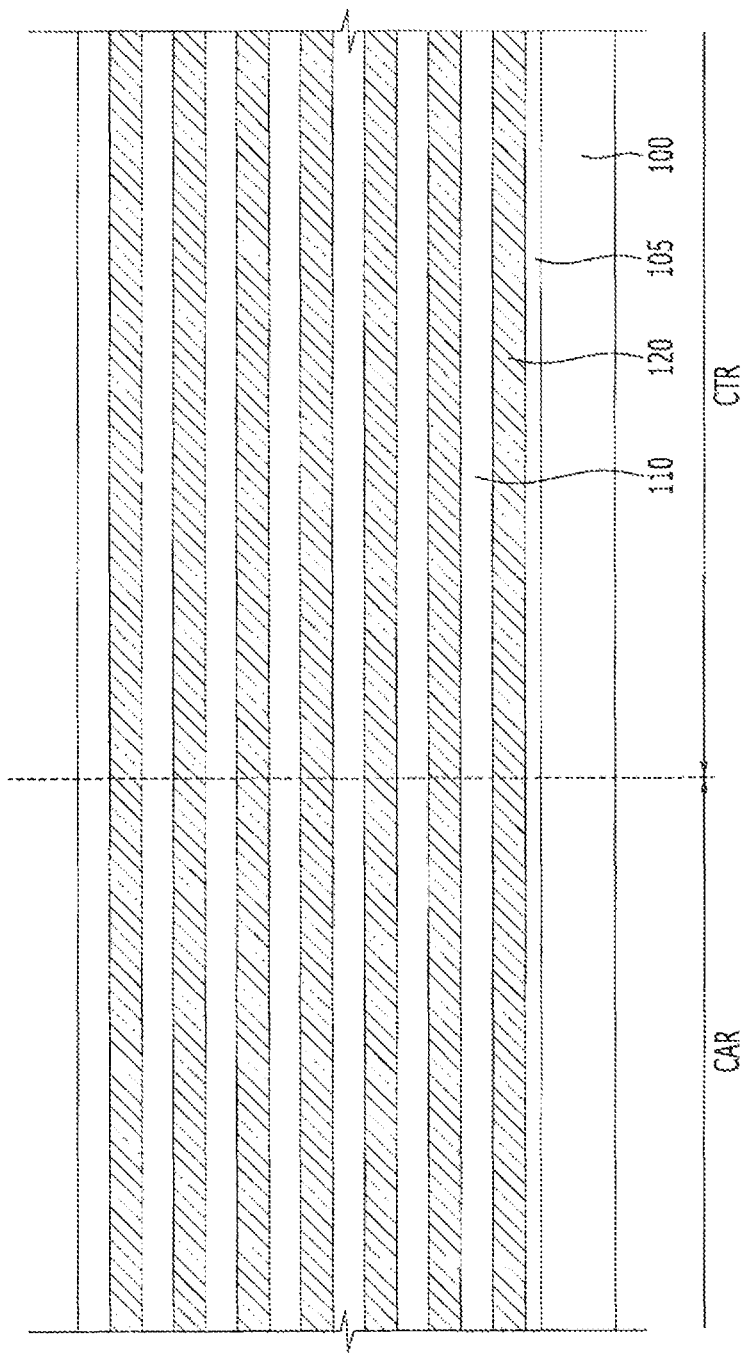
FIGS. 10, 11, 12, 13, 14, 15, 16, 17, and 18 are cross-sectional views illustrating intermediate operations of methods of manufacturing semiconductor memory devices according to some embodiments of the inventive concepts of the inventive concepts.

Referring to FIG. 10, the lower insulating layer 105 may be formed on the substrate 100 including the cell array region CAR and the contact region CTR. Further, the plurality of insulating layers 110 and the plurality of sacrificial layers 120 may be alternately formed on the lower insulating layer 105.

The plurality of insulating, layers 110 may be formed as silicon oxide layers and the plurality of sacrificial layers 120 may be formed as silicon nitride layers, silicon oxynitride layers, or silicon layers.

The plurality of insulating layers 110 and the plurality of sacrificial layers 120 may be deposited using a thermal CVD, plasma enhanced CVD, physical CVD, or atomic layer deposition (ALD) process.

Figure 11:
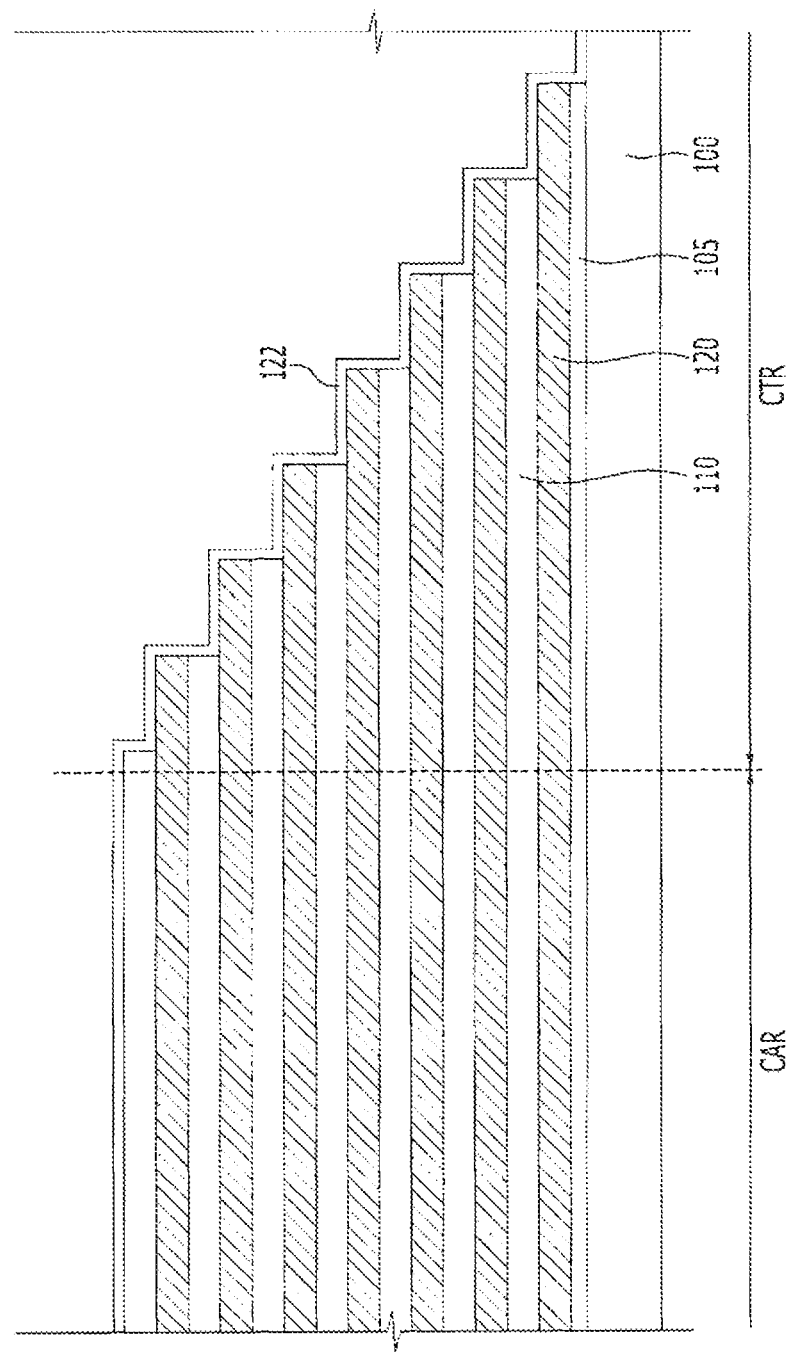

Referring to FIG. 11, the plurality of insulating layers 110 and sacrificial layers 120 may be patterned in the stepwise structure in the contact region CTR and the auxiliary insulating layer 122 may be formed thereon.

Although one process is described below with respect to some embodiments of the inventive concepts, the process of patterning the plurality of insulating layers 110 and sacrificial layers 120 in the stepwise structure is not limited thereto.

For example, a mask pattern may be formed on the uppermost insulating layer 110 and the uppermost insulating layer 110 may be etched using the mask pattern as an etching, mask to expose a second upper sacrificial layer 120 and a second upper insulating layer 110. Subsequently, the width of the mask pattern may be reduced by etching the mask pattern and the second upper sacrificial layer 120 and the second upper insulating layer 110 may be etched by using the etched mask pattern as the etching mask. The etching process of the insulating layer 110 and the sacrificial layer 120 and the etching process of the mask pattern may be repeatedly performed to form the sacrificial layer 120 and the insulating layer 110 in the contact region CTR in the stepwise structure.

The mask pattern may be removed after the etching process. Then, the auxiliary insulating layer 122 may be formed on the substrate 100. The auxiliary insulating layer 122 may be, for example, a silicon oxide layer.

Figure 12:
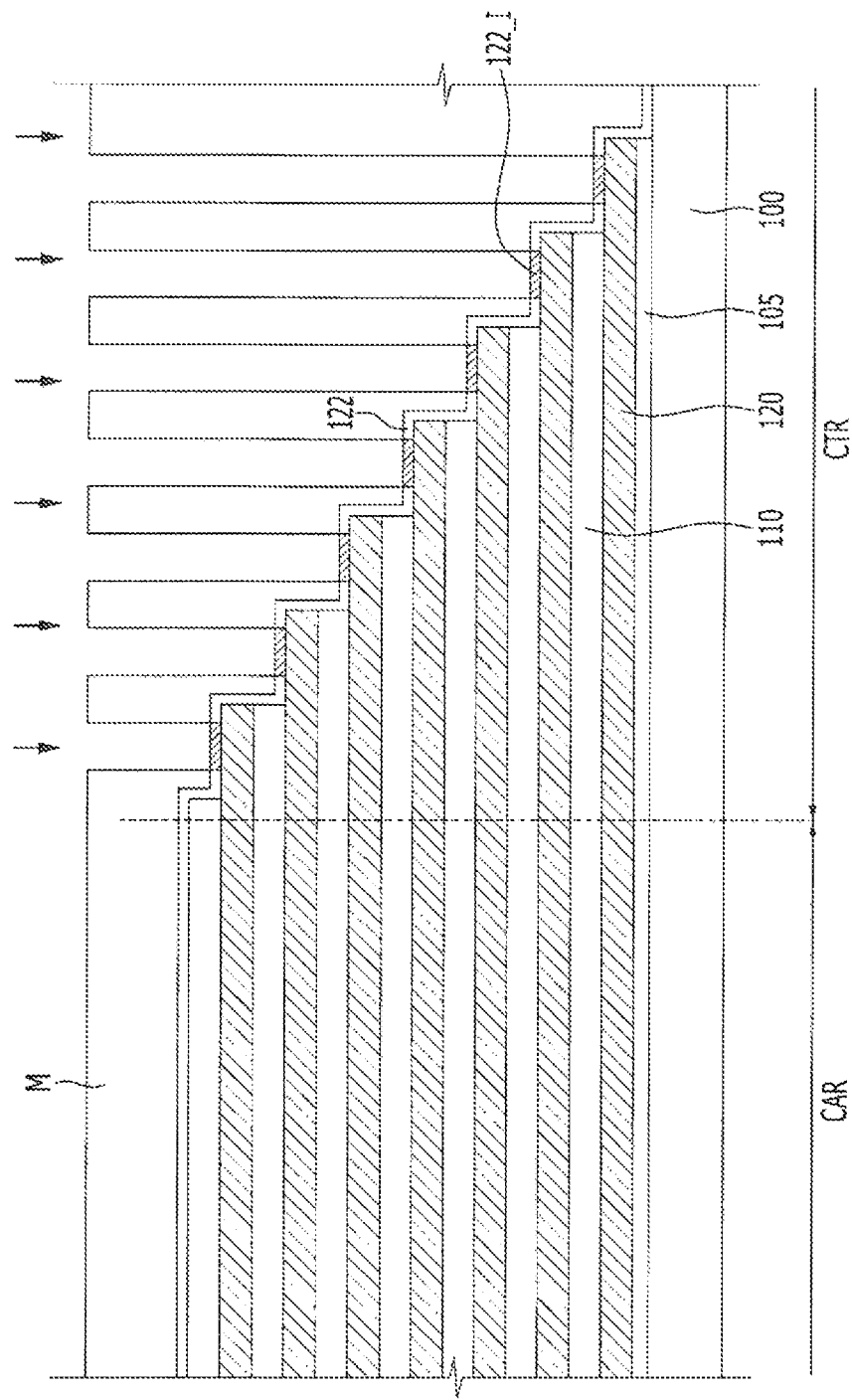

Referring to FIG. 12, a photosensitive resin pattern M may be formed on the auxiliary insulating layer 122. A region of the auxiliary insulating layer 122 exposed by the photosensitive resin pattern M may include a region 122_I. The region 122_I may be doped with predetermined ions. The photosensitive resin pattern M include a pattern to expose the region 122_I for forming the protrusion pad.

An ion injection process may be performed on a whole surface of the photosensitive resin pattern M. Materials used for doping in the ion injection process may be, for example, boron (B), phosphorus (P), and the like.

According to the ion injection process, the auxiliary insulating layer 122 exposed by the photosensitive resin pattern M may include the region 122_I doped with the predetermined material. The doped region 122_I may have a different etching ratio from another region of the auxiliary insulating layer 122 which overlaps with the photosensitive resin pattern M.

Figure 13:
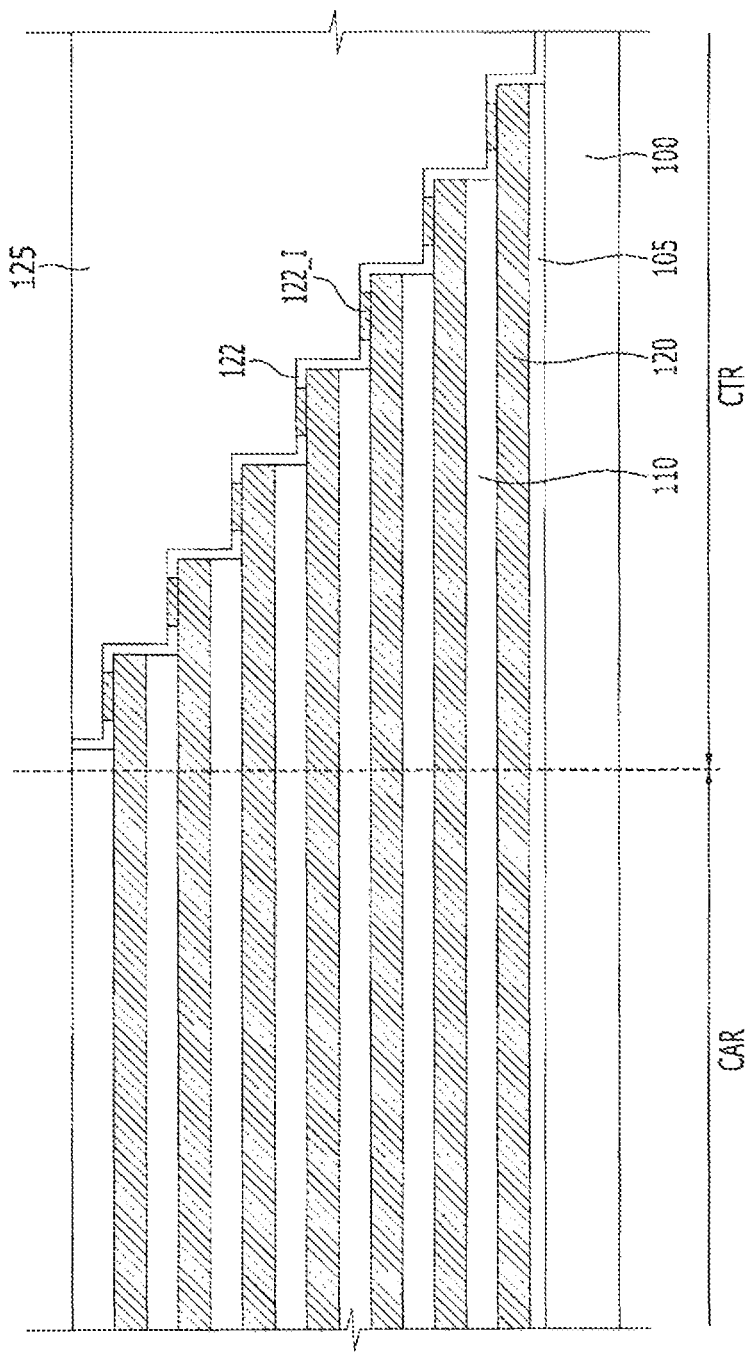

Thereafter, as illustrated in FIG. 13, the buried insulating layer 125 may be formed on the auxiliary insulating layer 122.

The buried insulating layer 125 may be formed by applying an insulating material after removing the photosensitive resin pattern M of FIG. 12. The applied insulating material may be planarized so as to be coplanar with the uppermost insulating layer 110 or an uppermost surface of the auxiliary insulating layer 122.

Further, in the planarization process, the auxiliary insulating layer 122 in the cell array region CAR may be removed. However, the inventive concepts are not limited thereto and the auxiliary insulating layer 122 may not be removed or one layer not distinguished from the uppermost insulating layer 110 may be formed.

Figure 14:
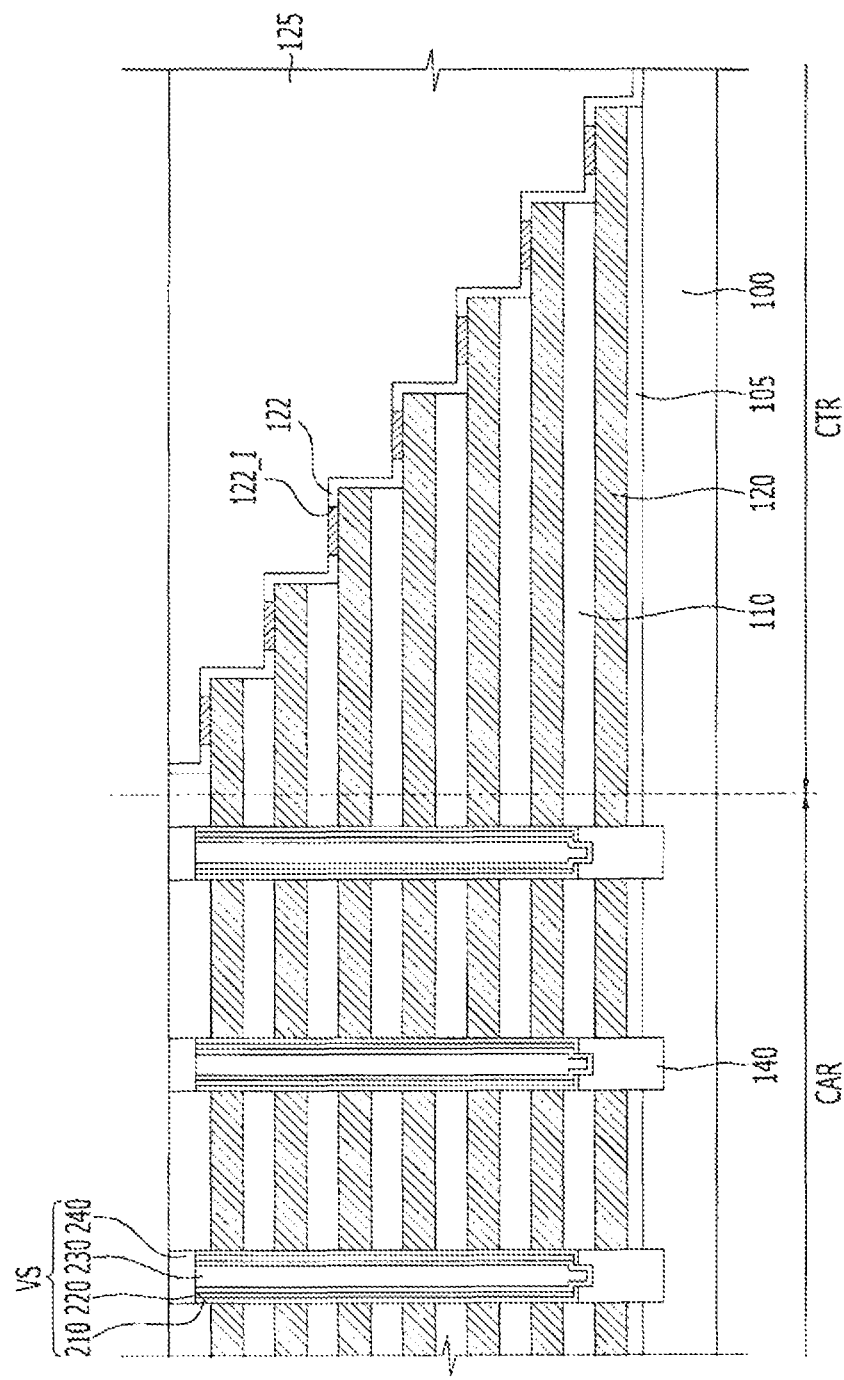

Next, referring to FIG. 14, the vertical pattern structure VS may be formed in the cell array region CAR.

In, detail, a vertical hole 130 may be formed to expose the substrate 100, by consecutively patterning the insulating layers 110, the sacrificial layers 120, and the lower insulating layer 105. A plurality of vertical, holes 130 may be arrayed in a zigzag pattern or arrayed in one direction from the viewpoint of the plane.

Subsequently, the vertical pattern structure VS may be formed in the vertical hole 130. The vertical pattern structure VS may include a lower semiconductor pattern 140 protruding from the uppermost surface of the substrate 100, a vertical insulating pattern 210 on the lower semiconductor pattern 140 and along the inner surface of the vertical hole 130, a second semiconductor pattern SP2 along the inner surface of the vertical insulating pattern 210, a first semiconductor pattern SP1 along the inner surface of the second semiconductor pattern SP2, a filling insulating pattern 230 in the first semiconductor pattern SP1, and a conductive pad 240 on uppermost surfaces thereof.

Figure 15:
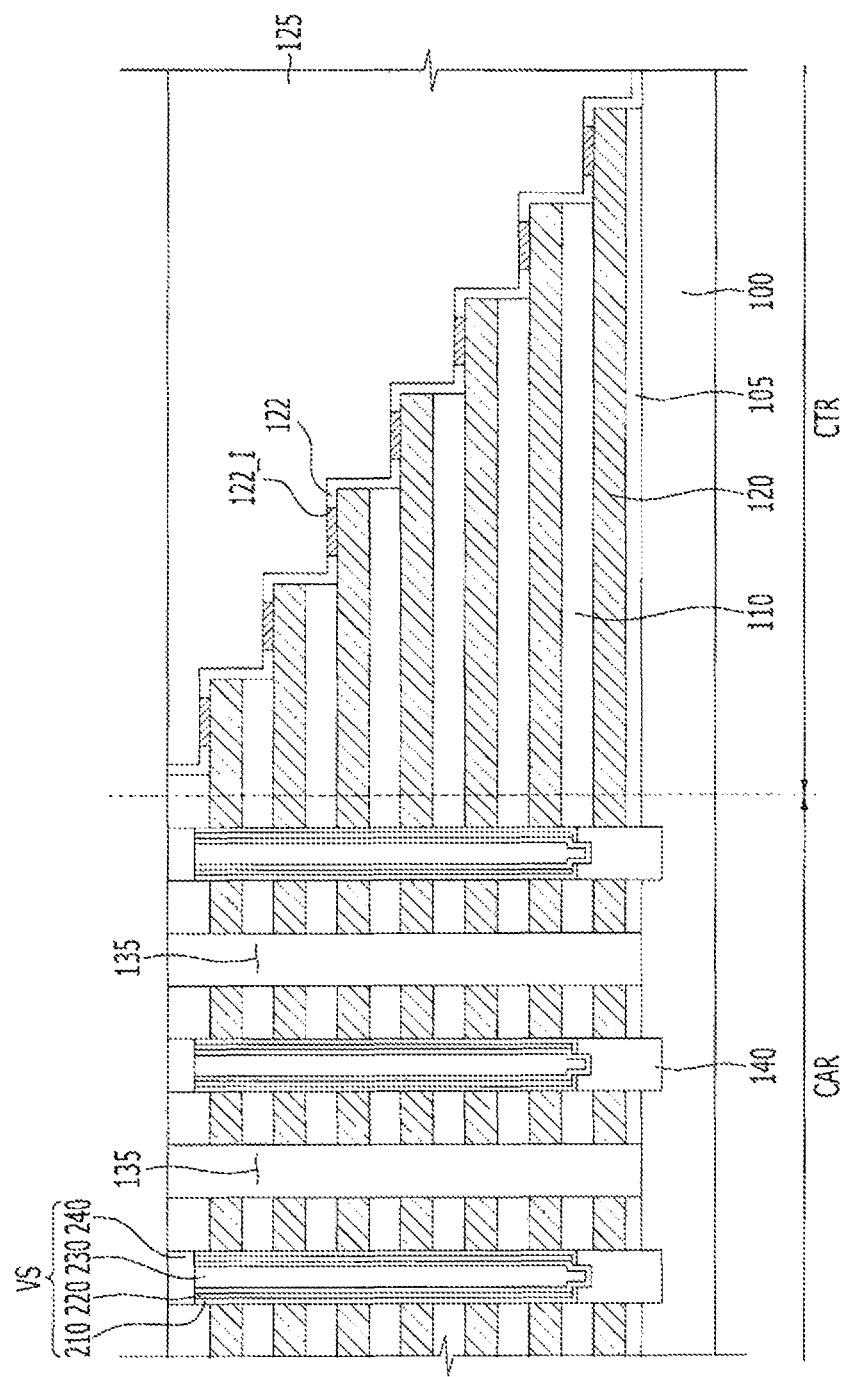

Next, referring to FIG. 15, a trench 135 may be formed to expose the substrate 100 by patterning the buried insulating layer 125, the insulating layers 110, the sacrificial layers 120, and the lower insulating layer 105.

Figure 16:
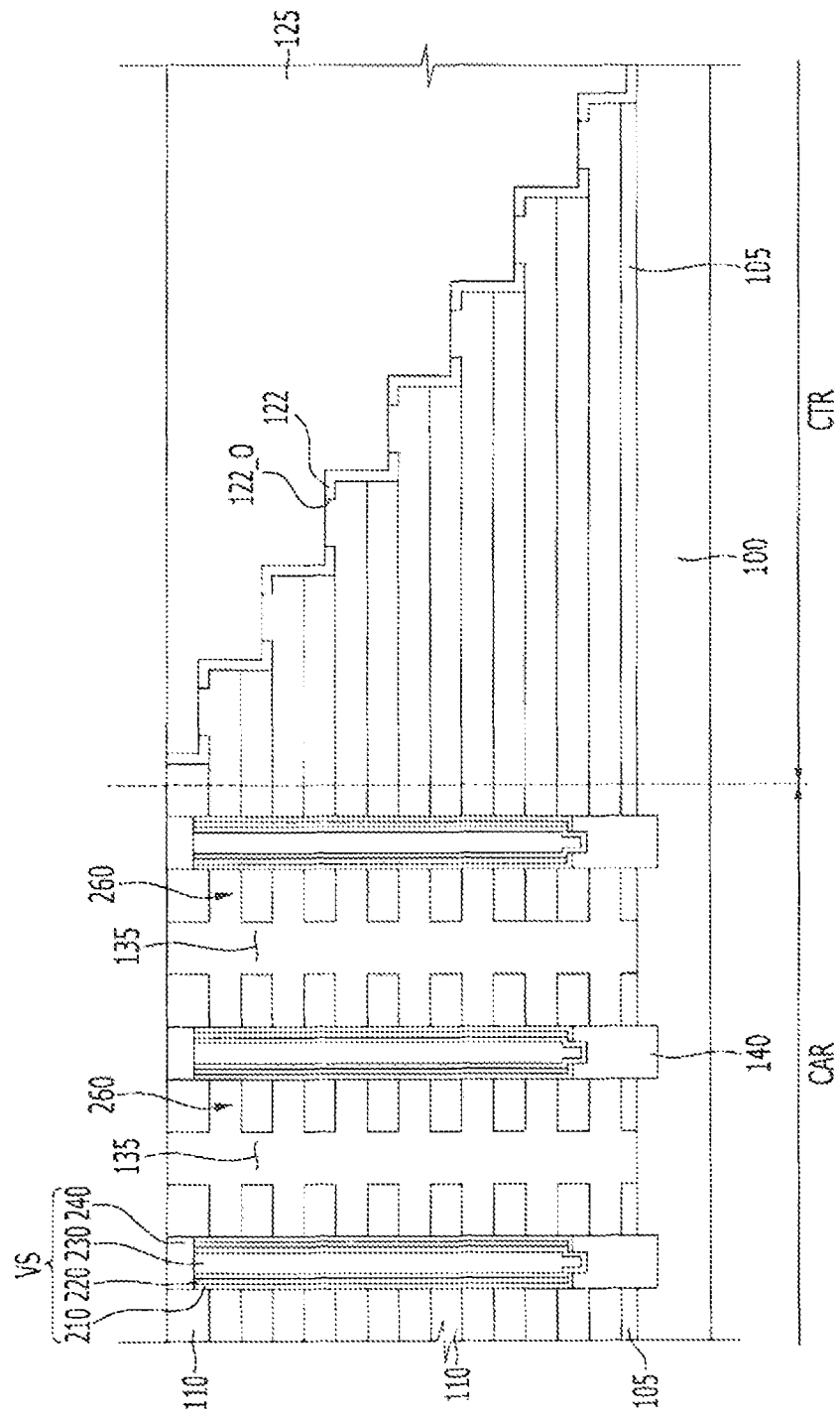

Then, referring to FIG. 16, the sacrificial layers 120 exposed by the trench 135 may be removed to form gaps 260 between the insulating layers 110. The gaps 260 may include a region in which the sacrificial layer 120 is removed.

The gaps 260 according to some embodiments of the inventive concepts may include the opening 122_O included in the auxiliary insulating layer 122. The opening 122_O may be a region in which the region 122_I doped with the predetermined ion is removed from the auxiliary insulating layer 122. The opening 122_O may be removed simultaneously with the process of removing the sacrificial layer 120 or removed through a separate process after removing the sacrificial layer 120. Since the doped region 122_I has a different etching ratio from another region of the auxiliary insulating layer 122, the doped region 122_I may be removed without a damage to the auxiliary insulating layer 122 by using a predetermined etching solution.

In embodiments wherein the sacrificial layer 120 includes a silicon nitride layer or a silicon oxynitride layer, the removing process of the sacrificial layer 120 may be performed by using an etching solution including phosphoric acid.

Figure 17:
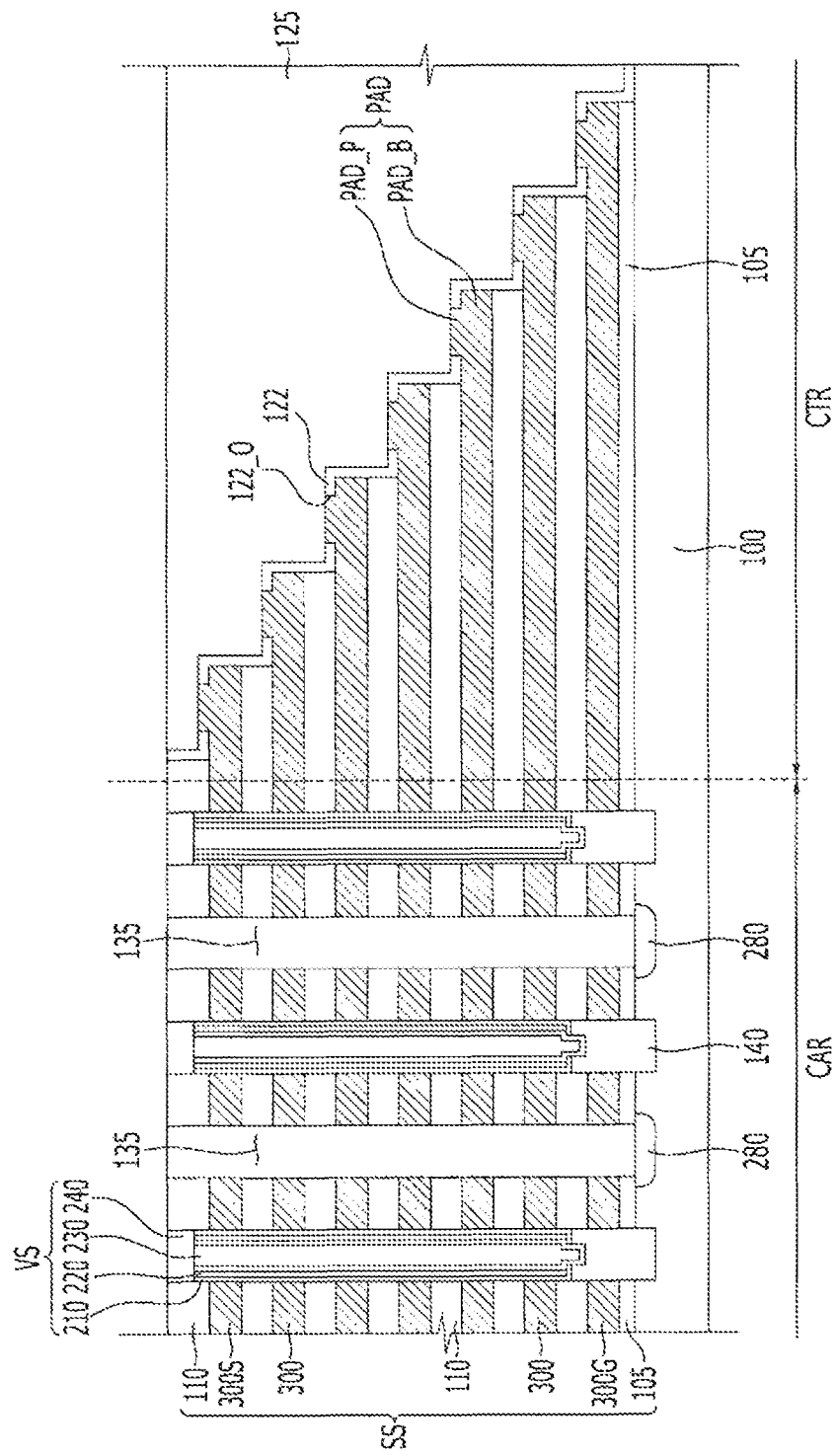

Next, as illustrated in FIG. 17, the gate electrodes 300 filling the gaps 260 may be formed and the common source region 280 may be formed on the substrate 100.

The material forming the gate electrode 300 may not fully fill the trench 135 while filling the gaps 260 illustrated in FIG. 16. A conductive layer formed outside the gaps 260 may be removed. The material forming the gate electrode 300 while filling the gaps 260 may be filled so as to form the base pad PAD_B and the protrusion pad PAD_P constituting the pad unit PAD. In other words, the base pad PAD_B and the protrusion pad PAD_P may include a common material composition.

The common source region 280 may be formed by an ion injection process and formed in the substrate 100 exposed by the trench 135. The common source region 280 may form a pn junction with the substrate 100.

Figure 18:
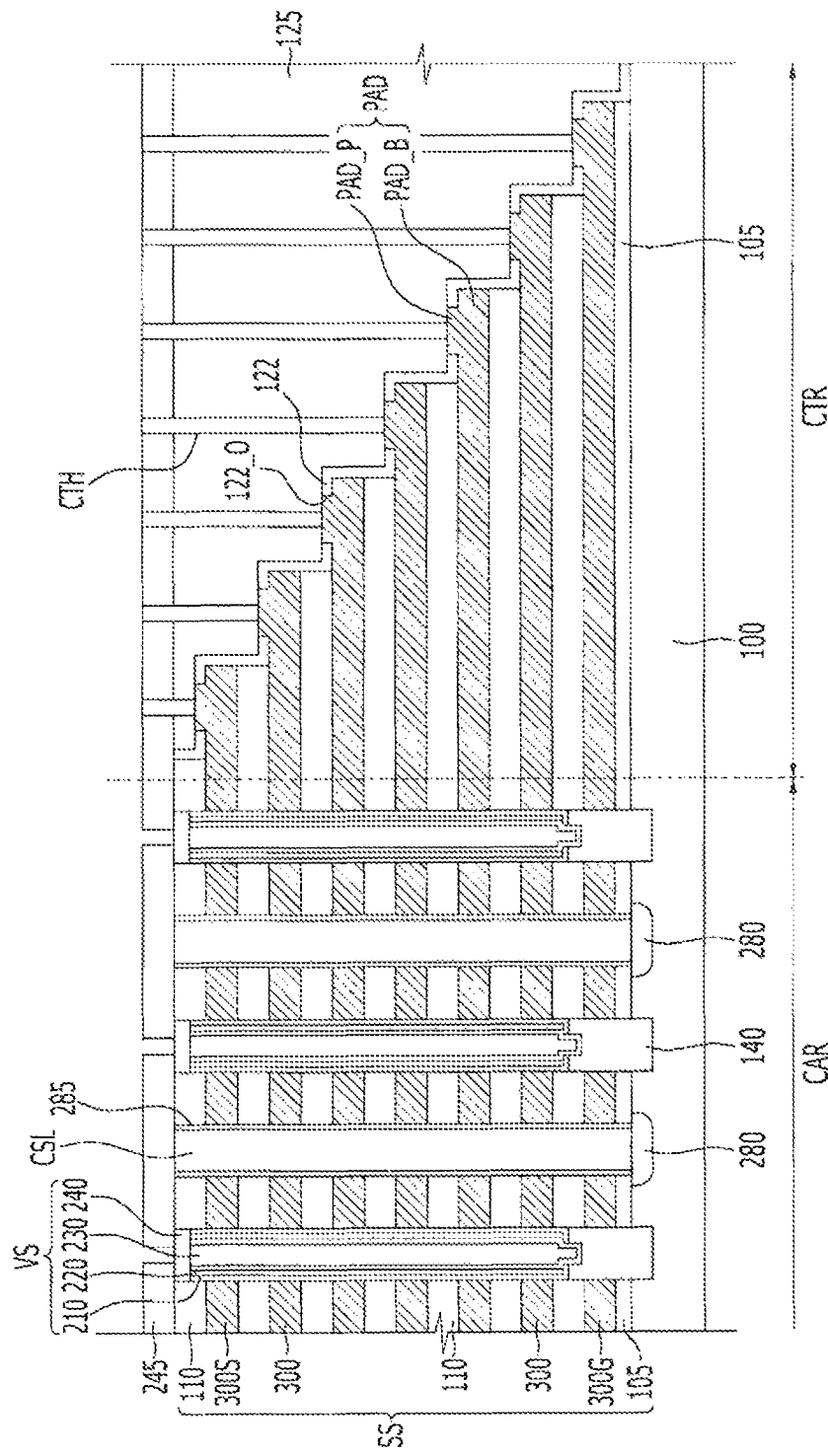

A trench spacer 285 may be formed on the side wall of the trench 135 as illustrated in FIG. 18 and the common source line CSL, which extends in the x direction while filling the trench 135 illustrated in FIG. 17 may be formed. Further, the capping layer 245 may be formed on the stacking structure SS and contact holes CTH may be formed to expose the conductive pads 240 and/or the protrusion pads PAD_P.

The common source line CSL may be electrically connected by contacting the common source region 280. The trench spacer 285 may electrically insulate the gate electrode 300 from the common source line CSL. The trench spacer 285 may include an insulating material such as silicon oxide or nitride. The common source line CSL may include a metallic material such as tungsten, titanium, tantalum, platinum, and/or metal silicide.

Thereafter, the word line contact plug 415 may be formed to electrically and physically connect the pad unit PAD and the connection line CTL by penetrating the contact hole CTH illustrated in FIG. 18. Further, the bit line contact plug 315 may be formed to connect the vertical pattern structure VS and the bit line BTL to form the semiconductor memory device illustrated in FIG. 4B.

Figure 19:
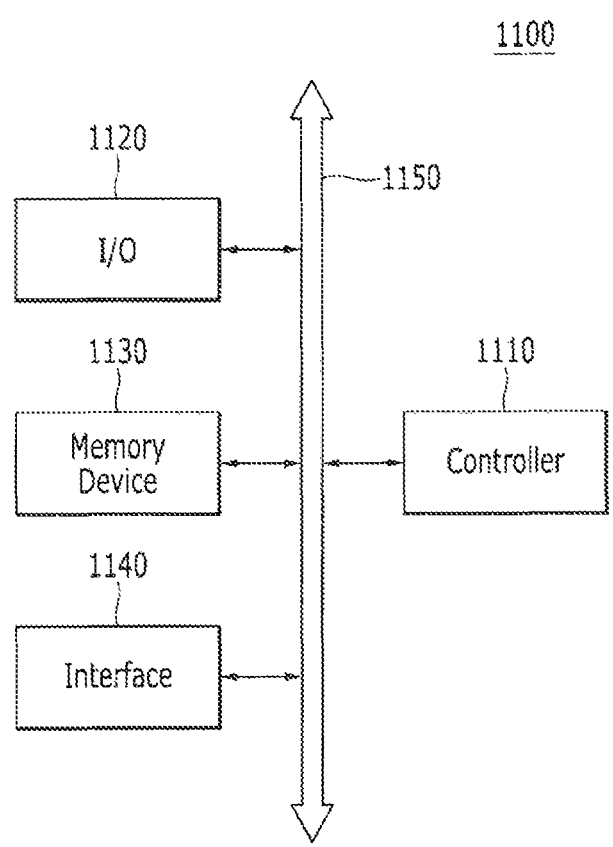
FIG. 19 is a block diagram schematically illustrating an electronic system including a semiconductor memory device according to some embodiments of the inventive concepts.

Hereinafter, an electronic system including the semiconductor memory device will be described in brief with reference to FIG. 19. FIG. 19 is a block diagram schematically illustrating an electronic system including a semiconductor memory device according to some embodiments of the inventive concepts.

Referring to FIG. 19, an electronic system 1100 according to some embodiments of the inventive concepts may include a controller 1110, an input output device (I/O) 1120, a memory device 1130, an interface 1140, and a bus 1150. At least two of the controller 1110, the input/output device 1120, the memory device 1130, and the interface 1140 may be coupled with each other through the bus 1150. The bus 1150 may be a path for data to move.

The controller 1110 may include a microprocessor, a digital signal processor, a microcontroller, and/or logic devices capable of performing similar functions thereto. The input/output device 1120 may include a keypad, a keyboard, and/or a display device. The memory device 1130 may store data and/or commands. The memory device 1130 may include the semiconductor memory device disclosed in the aforementioned embodiments. The memory device 1130 may further include a phase-change memory device, a magnetic memory device, a DRAM device, and/or an SRAM device. The interface 1140 may perform a function to transmit the data to a communication network and/or receive the data from the communication network. The interface 1140 may be a wired or wireless type. For example, the interface 1140 may include an antenna or a wired/wireless transceiver. In some embodiments, the electronic system 1100 may further include a high-speed DRAM device and/or a high-speed SRAM device as an operation memory device for improving an operation of the controller 1110.

The electronic system 1100 may be applied to a personal digital assistant (PDA), a portable computer, a web tablet, a wireless phone, a mobile phone, a digital music player, a memory card, and/or any electronic products which may transmit and receive information in a wireless environment.

Although some embodiments of the inventive concepts have been described and illustrated as above, the inventive concepts are not limited to the embodiments described herein, and various changes and modifications may be made to these embodiments without departing from the spirit and the scope of the inventive concepts.

While the inventive concepts have been described in connection with some embodiments, it is to be understood that the inventive concepts are not limited to the disclosed embodiments, but, on the contrary, are intended to include various modifications and equivalent arrangements that may be included within the spirit and scope of the inventive concepts and may be, recited in the appended claims.

What is claimed is:

1. A semiconductor memory device comprising:
a substrate comprising a cell array region and a contact region;
a stacking structure comprising a plurality of insulating layers and a plurality of gate electrodes alternately stacked on the substrate, the stacking structure comprising a stepwise structure in the contact region, wherein ones of the plurality of gate electrodes comprise a respective pad unit that comprises a step of the stepwise structure; and
contact plugs on the pad units,
wherein at least one of the pad units comprises a base pad and a protrusion pad on the base pad,
wherein the protrusion pad is between and spaced apart from two edges of a surface of the base pad that are perpendicular to an extension direction of the respective gate electrode,
wherein the protrusion pad contacts one of the contact plugs,
wherein the protrusion pad extends from a portion of the base pad, and
wherein an area of the protrusion pad is smaller than an area of the base pad in a plan view.

2. The semiconductor memory device of claim 1, wherein the protrusion pad comprises an island shape that is on the base pad.

3. The semiconductor memory device of claim 1, wherein a minimum distance between two adjacent pad units, among the pad units, is smaller than a thickness of an insulating layer positioned between the two adjacent pad units.

4. The semiconductor memory device of claim 1, wherein the protrusion pad is between and spaced apart from two edges of the surface of the base pad that are parallel to the extension direction of the gate electrode.

5. The semiconductor memory device of claim 4, wherein, in the stepwise structure, the pad units are inclined stepwise in the extension direction of the gate electrode and inclined stepwise in a direction that is perpendicular to the extension direction of the gate electrode.

6. The semiconductor memory device of claim 1, wherein the at least one of the pad units that comprises a protrusion pad comprises a first pad unit adjacent to an uppermost insulating layer and a second pad unit adjacent to the substrate, and
wherein a width of the protrusion pad of the first pad unit adjacent to the uppermost insulating layer is larger than a width of the protrusion pad of the second pad unit adjacent to the substrate.

7. The semiconductor memory device of claim 1, further comprising an auxiliary insulating layer on the pad units in the contact region.

8. The semiconductor memory device of claim 7, wherein the auxiliary insulating layer contacts the surface of the base pad and side surface of the pad units.

9. The semiconductor memory device of claim 7, wherein an uppermost surface of the auxiliary insulating layer and the uppermost surface of the protrusion pad are coplanar with each other.

10. A semiconductor memory device comprising:
a substrate comprising a cell array region and a contact region;
a stacking structure comprising a plurality of insulating layers and a plurality of gate electrodes alternately stacked on the substrate, the stacking structure comprising a stepwise structure in the contact region, wherein ones of the plurality of gate electrodes comprise a respective pad unit that comprises a step of the stepwise structure; and
contact plugs on the pad units,
wherein at least one of the pad units comprises a base pad and a protrusion pad on the base pad,
wherein the protrusion pad is between and spaced apart from two edges of a surface of the base pad that are perpendicular to an extension direction of the respective gate electrode,
wherein the protrusion pad contacts one of the contact plugs, and
wherein a side of the protrusion pad is coplanar with a side of the base pad in a direction parallel to the extension direction of the gate electrode.

11. A semiconductor memory device comprising:
a substrate comprising a cell array region and a contact region;
a stacking structure comprising a plurality of insulating layers and a plurality of gate electrodes alternately stacked on the substrate, the stacking structure comprising a stepwise structure in the contact region, wherein ones of the plurality of gate electrodes comprise a respective pad unit that comprises a step of the stepwise structure; and
contact plugs on the pad units,
wherein at least one of the pad units comprises a base pad and a protrusion pad on the base pad,
wherein the protrusion pad is between and spaced apart from two edges of a surface of the base pad that are perpendicular to an extension direction of the respective gate electrode,
wherein the protrusion pad contacts one of the contact plugs, and
wherein the pad units' comprise at least one pad unit that does not include the protrusion pad.

12. The semiconductor memory device of claim 11, wherein the at least one pad unit that does not include the protrusion pad comprises at least one pad unit adjacent to the substrate among the pad units that do not include the protrusion pad and at least one pad unit adjacent to an uppermost insulating layer among the pad units that do not include the protrusion pad.

* * * * *